United States Patent
Sasaki et al.

(10) Patent No.: US 11,793,088 B2
(45) Date of Patent: *Oct. 17, 2023

(54) SPIN-ORBIT TORQUE TYPE MAGNETORESISTANCE EFFECT ELEMENT, AND METHOD FOR PRODUCING SPIN-ORBIT TORQUE TYPE MAGNETORESISTANCE EFFECT ELEMENT

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/978,496

(22) Filed: Nov. 1, 2022

(65) Prior Publication Data

US 2023/0057128 A1 Feb. 23, 2023

Related U.S. Application Data

(62) Division of application No. 16/547,670, filed on Aug. 22, 2019, now Pat. No. 11,522,124, which is a
(Continued)

(30) Foreign Application Priority Data

Oct. 27, 2016 (JP) .................................. 2016-210530
Jul. 14, 2017 (JP) .................................. 2017-138384

(51) Int. Cl.
*G11C 11/16* (2006.01)
*H10N 52/00* (2023.01)
(Continued)

(52) U.S. Cl.
CPC ......... *H10N 52/101* (2023.02); *G11C 11/161* (2013.01); *G11C 11/18* (2013.01);
(Continued)

(58) Field of Classification Search
CPC ...... H10N 52/101; H10N 50/01; H10N 50/10; H10N 50/85; H10N 52/80; H10N 50/80;
(Continued)

(56) References Cited

U.S. PATENT DOCUMENTS

| | | | |
|---|---|---|---|
| 4,944,831 | A | 7/1990 | Sibuet |
| 6,765,823 | B1 | 7/2004 | Zhu et al. |

(Continued)

FOREIGN PATENT DOCUMENTS

| | | |
|---|---|---|
| CN | 104465983 A | 3/2015 |
| CN | 104465984 A | 3/2015 |

(Continued)

OTHER PUBLICATIONS

I. M. Miron et al., "Perpendicular Switching of a Single Ferromagnetic Layer Induced By In-Plane Current Injection", Nature, vol. 476, (2011), pp. 189-194.

(Continued)

*Primary Examiner* — Fernando Hidalgo
(74) *Attorney, Agent, or Firm* — Oliff PLC

(57) ABSTRACT

A spin-orbit torque type magnetoresistance effect element including a magnetoresistance effect element having a first ferromagnetic metal layer with a fixed magnetization direction, a second ferromagnetic metal layer with a varying magnetization direction, and a non-magnetic layer sandwiched between the first ferromagnetic metal layer and the second ferromagnetic metal layer; and spin-orbit torque wiring that extends in a first direction intersecting with a stacking direction of the magnetoresistance effect element and that is joined to the second ferromagnetic metal layer; wherein the magnetization of the second ferromagnetic metal layer is oriented in the stacking direction of the magnetoresistance effect element; and the second ferromagnetic metal layer has shape anisotropy, such that a length (Continued)

along the first direction is greater than a length along a second direction orthogonal to the first direction and to the stacking direction.

8 Claims, 13 Drawing Sheets

Related U.S. Application Data division of application No. 15/702,290, filed on Sep. 12, 2017, now Pat. No. 10,439,130.

(51) Int. Cl.
| | |
|---|---|
| *G11C 11/18* | (2006.01) |
| *H10B 61/00* | (2023.01) |
| *H10N 50/01* | (2023.01) |
| *H10N 50/10* | (2023.01) |
| *H10N 50/85* | (2023.01) |
| *H10N 52/80* | (2023.01) |

(52) U.S. Cl.
CPC .............. *H10B 61/22* (2023.02); *H10N 50/01* (2023.02); *H10N 50/10* (2023.02); *H10N 50/85* (2023.02); *H10N 52/80* (2023.02); G11C 11/1659 (2013.01); G11C 11/1673 (2013.01); G11C 11/1675 (2013.01)

(58) Field of Classification Search
CPC ... G11C 11/161; G11C 11/18; G11C 11/1659; G11C 11/1673; G11C 11/1675; H10B 61/22; G11B 5/3929
USPC ........................................................ 257/421
See application file for complete search history.

(56) References Cited

U.S. PATENT DOCUMENTS

| | | | |
|---|---|---|---|
| 7,274,080 | B1 | 9/2007 | Parkin |
| 8,350,347 | B2 | 1/2013 | Gaudin et al. |
| 9,478,309 | B2 | 10/2016 | Nebashi et al. |
| 9,608,039 | B1 | 3/2017 | Apalkov et al. |
| 9,691,458 | B2 | 6/2017 | Ralph et al. |
| 9,715,916 | B1* | 7/2017 | Tomishima ......... G11C 11/1657 |
| 10,319,901 | B2* | 6/2019 | Sasaki .................... H10N 50/85 |
| 10,418,545 | B2 | 9/2019 | Sasaki et al. |
| 10,439,130 | B2* | 10/2019 | Sasaki .................... H10B 61/22 |
| 10,797,231 | B2 | 10/2020 | Sasaki et al. |
| 11,276,815 | B2* | 3/2022 | Sasaki .................... H10N 50/85 |
| 11,522,124 | B2* | 12/2022 | Sasaki .................... H10N 50/10 |
| 2002/0145902 | A1 | 10/2002 | Kunikiyo et al. |
| 2004/0089904 | A1 | 5/2004 | Bhattacharyya et al. |
| 2007/0064472 | A1 | 3/2007 | Kawagoe et al. |
| 2008/0151614 | A1 | 6/2008 | Guo |
| 2009/0109739 | A1 | 4/2009 | Ranjan et al. |
| 2010/0073806 | A1 | 3/2010 | Koui et al. |
| 2010/0271870 | A1 | 10/2010 | Zheng et al. |
| 2011/0044099 | A1 | 2/2011 | Dieny |
| 2012/0267734 | A1 | 10/2012 | Sasaki et al. |
| 2012/0320666 | A1 | 12/2012 | Ohno et al. |
| 2013/0107395 | A1 | 5/2013 | Nagasawa et al. |
| 2014/0056060 | A1 | 2/2014 | Khvalkovskiy et al. |
| 2014/0169088 | A1 | 6/2014 | Buhrman et al. |
| 2015/0129995 | A1 | 5/2015 | Wang et al. |
| 2015/0213865 | A1* | 7/2015 | Wu ............................. G11C 11/18 365/158 |
| 2015/0348606 | A1 | 12/2015 | Buhrman et al. |
| 2016/0225424 | A1 | 8/2016 | Qiu et al. |
| 2016/0247550 | A1 | 8/2016 | Fukami et al. |
| 2016/0315249 | A1 | 10/2016 | Kardasz et al. |
| 2017/0141297 | A1 | 5/2017 | Apalkov et al. |
| 2017/0178705 | A1 | 6/2017 | Buhrman et al. |
| 2017/0222135 | A1 | 8/2017 | Fukami et al. |
| 2018/0005677 | A1 | 1/2018 | Gaudin et al. |
| 2018/0033953 | A1 | 2/2018 | Sasaki et al. |
| 2018/0108706 | A1* | 4/2018 | Mahajan ................ H10N 50/01 |

FOREIGN PATENT DOCUMENTS

| | | | |
|---|---|---|---|
| CN | 105759560 A | 7/2016 | |
| JP | 2011-138604 A | 7/2011 | |
| JP | 2014-207469 A | 10/2014 | |
| TW | 201037703 A * | 10/2010 | ............. G11C 11/16 |
| WO | 2016/021468 A1 | 2/2016 | |
| WO | 2016/113503 A1 | 7/2016 | |

OTHER PUBLICATIONS

Y. K. Kato et al., "Observation of the Spin Hall Effect in Semiconductors" Science, vol. 306, (2004), pp. 1910-1913.
L. Liu et al., "Spin Torque Switching With the Giant Spin Hall Effect of Tantalum", Science, vol. 336, (2012), p. 555.
L. Liu et al., "Current-Induced Switching of Perpendicularly Magnetized Magnetic Layers Using Spin Torque From the Spin Hall Effect" Physical Review Letters, vol. 109, (2012), pp. 096602-1-0096602-5.
KS. Lee et al., "Threshold Current for Switching of a Perpendicular Magnetic Layer Induced By Spin Hall Effect", Applied Physics Letters, vol. 102, (2013), pp. 112410.
KS. Lee et al., "Thermally Activated Switching of Perpendicular Magnet By Spin-Orbit Torque", Applied Physics Letters, vol. 104, (2014), pp. 072413-1-072413-5.
S. Fukami et al., "Magnetization Switching By Spin-Orbit Torque in an Antiferromagnet-Ferromagnet Bilayer System", Nature Materials, vol. 15, (2016), pp. 535-542.
S. Fukami et al., "A Spin-Orbit Torque Switching Scheme With Collinear Magnetic Easy Axis and Current Configuration", Nature Technology, vol. 11, (2016), pp. 621.
S. Takahashi et al., "Spin Injection and Detection in Magnetic Nanostructures",Physical Review B, vol. 67, (2003), pp. 052409-1-052409-4.
Y. Seo et al., "Area-Efficient SOT-MRAM With a SCHOTTKY Diode", IEEE Electron Device Letters, vol. 37, No. 8, (2016), pp. 982-985.
Guoqiang Yu et al., "Current-Driven Perpendicular Magnetization Switching in Ta/CoFeB/[TaOx or MgO/TaOx] Films with Lateral Structural Asymmetry" Applied Physics Letters, vol. 105, pp. 102411-102411-5, (2014).
Aug. 27, 2018 Office Action issued in U.S. Appl. No. 15/705,991.
Yu, Guoqiang et al., "Switching of perpendicular magnetization by spin-orbit torques in the absence of external magnetic fields", Nature Nanotechnology, pp. 548-554, vol. 9, (2014).
Dec. 11, 2018 Office Action issued in U.S. Appl. No. 15/642,003.
Apr. 16, 2018 Office Action issued in U.S. Appl. No. 15/642,003.
Feb. 20, 2020 Office Action issued in U.S. Appl. No. 16/359,040.
You Long, et al., "Switching of Perpendicularly Polarized Nanomagnets with Spin Orbit Torque Without an External Magnetic Field by Engineering a Tilted Anisotropy," Proceedings of the National Academy of Sciences of the United States of America, Aug. 18, 2015, vol. 112, No. 33, pp. 10310-10315.
Dec. 30, 2020 Office Action issued in U.S. Appl. No. 16/516,333.
Jul. 22, 2021 Office Action issued in U.S. Appl. No. 17/010,329.
Apr. 15, 2022 Office Action issued in U.S. Appl. No. 16/547,670.

* cited by examiner

FIG. 8
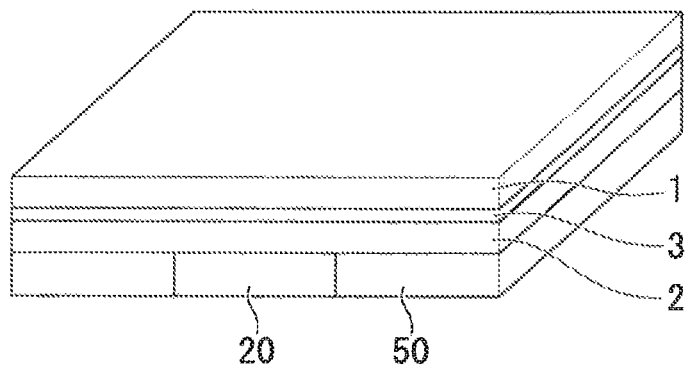
(a)
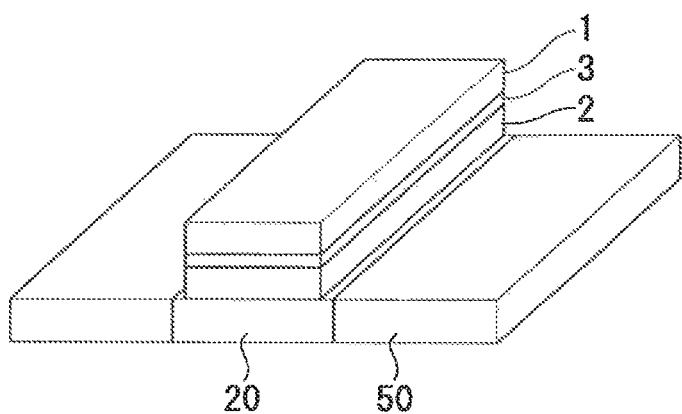
(b)
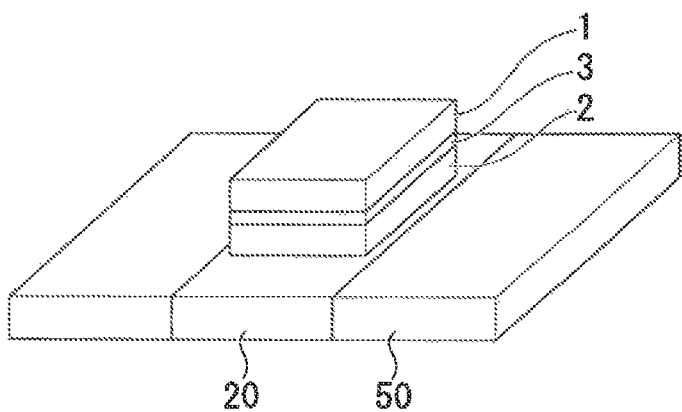
(c)

SPIN-ORBIT TORQUE TYPE MAGNETORESISTANCE EFFECT ELEMENT, AND METHOD FOR PRODUCING SPIN-ORBIT TORQUE TYPE MAGNETORESISTANCE EFFECT ELEMENT

BACKGROUND OF THE INVENTION

Field of the Invention

The present invention relates to a spin-orbit torque type magnetoresistance effect element, and a method for producing a spin-orbit torque type magnetoresistance effect element.

This is a continuation of application Ser. No. 16/547,670, filed Aug. 22, 2019, which is a Division of application Ser. No. 15/702,290 filed Sep. 12, 2017, now U.S. Pat. No. 10,439,130, which claims priority to Japanese Patent Application No. 2016-210530, filed Oct. 27, 2016, and Japanese Patent Application No. 2017-138384, filed Jul. 14, 2017. The disclosure of the prior applications is hereby incorporated by reference herein in its entirety.

Description of Related Art

Examples of known magnetoresistance effect elements include giant magnetoresistance (GMR) elements composed of a multilayer film of ferromagnetic layers and non-magnetic layers, and tunnel magnetoresistance (TMR) elements which use insulating layers (tunnel barrier layers, barrier layers) for the non-magnetic layers. Generally, TMR elements have a larger element resistance than GMR elements, but the magnetoresistance (MR) ratio is larger than GMR elements. Consequently, TMR elements are attracting much attention as elements for magnetic sensors, high-frequency components, magnetic heads and non-volatile random access memory (MRAM).

MRAM reads and writes data by utilizing the characteristic that when the relative orientation between the magnetizations of two ferromagnetic layers that sandwich an insulating layer is changed, the element resistance of the TMR element changes. Examples of known methods for writing to MRAM include a method in which a magnetic field generated by an electric current is used to perform writing (magnetization reversal), and a method in which a spin transfer torque (STT) generated by passing an electric current through the stacking direction of a magnetoresistance effect element is used to perform writing (magnetization reversal).

In recent years, there has been a demand for higher integration of MRAM (for example, see Patent Document 1). In order to achieve high-density of integration of MRAM, the TMR elements must be made more compact. However, if the TMR elements are made more compact, the magnetization stability decreases. Decreases in the magnetization stability can cause rewriting of data under the influence of heat or the like (for example, see Patent Document 2). MRAM has the purpose of allowing long-term storage of data, and it is not permissible for the data to be spontaneously overwritten.

As methods for raising the magnetization stability, a method of increasing the volume of the ferromagnetic layers and a method of increasing the magnetic anisotropic energy of the ferromagnetic layers may be contemplated. However, magnetic anisotropic energy is material-specific, and depends on the material used in the ferromagnetic layers and the state of the interface between the ferromagnetic layers and the other layers. In order to achieve long-term storage of data, the volume of the ferromagnetic layers must be made a predetermined size or greater. For this reason, it is difficult to increase the magnetic anisotropic energy without taking these restrictions into consideration. The ferromagnetic layers are thin-films, for which the volumes are approximately the same as the areas.

RELATED LITERATURE (Patent Documents)

Patent Document 1
  JP 2014-207469 A
Patent Document 2
  JP 2011-138604 A (Non-Patent Documents)

Non-Patent Document 1
  I. M. Miron, K. Garello, G Gaudin, P.-J. Zermatten, M. V Costache, S. Auffret, S. Bandiera, B. Rodmacq, A. Schuhl, and P. Gambardella, Nature, 476, 189 (2011).

BRIEF SUMMARY OF THE INVENTION

The intensity of spin transfer torque (STT) is determined by the current density of the electric current flowing in the stacking direction of a magnetoresistance effect element. For this reason, in order to reverse the magnetization by means of spin transfer torque, the current density must be a predetermined value or greater. Conversely, in order to raise the thermal stability of the magnetoresistance effect element, an "area of a predetermined size or greater" is needed. Thus, in order to drive an element that reverses magnetization by STT, it is necessary to supply, in the stacking direction of the magnetoresistance effect element, an electric current having a current amount obtained by multiplying a "current density of a predetermined value or greater" with an "area of a predetermined size or greater".

However, if the current amount flowing through a single TMR element or GMR element is too large, the operating life of the element can be affected. For example, the insulating layers of the TMR element may undergo insulation breakdown and the element may become incapable of recording data.

Additionally, if the current amount flowing through a single TMR element or GMR element becomes large, then the current amount necessary for the MRAM overall will also become large. For example, when the elements are connected in parallel, a total current which is the "current amount necessary for a single element" x the "number of elements" will be necessary in the MRAM overall.

The present invention was made in view of the above-mentioned problems, and has the purpose of providing a spin-orbit torque type magnetoresistance effect element that has excellent magnetic recording properties and that only requires a small amount of current for magnetization reversal.

Accordingly, in recent years, much attention has been focused on magnetization reversal that utilizes pure spin current generated by spin-orbit interaction or the Rashba effect at the interface between different materials (for example, see Patent Document 1). Pure spin current generated by spin-orbit interaction induces spin-orbit torque (SOT), with this SOT causing magnetization reversal. Further, pure spin current generated by the Rashba effect at the interface between different materials can also cause magnetization reversal by SOT in a similar manner. A pure spin current is generated when an electron with upward spin and an electron with downward spin flow with the same frequency in opposing directions, so that the electric charge flows cancel each other out. As a result, the electric current flowing in the magnetoresistance effect element is zero.

The present inventors discovered that if such magnetoresistance effect elements that make use of SOT are used, electric current is not applied in the stacking direction of the magnetoresistance effect elements, and the amount of current that is necessary to drive the elements does not depend on the size of the magnetoresistance effect elements. The present inventors further discovered a configuration that allows the amount of current necessary for magnetization reversal of magnetoresistance effect elements to be reduced by making use of SOT.

In other words, the present invention provides the following means for solving the above-mentioned problems.

(1) The spin-orbit torque type magnetoresistance effect element according to a first embodiment comprises a magnetoresistance effect element having a first ferromagnetic metal layer with a fixed magnetization direction, a second ferromagnetic metal layer with a varying magnetization direction, and a non-magnetic layer sandwiched between the first ferromagnetic metal layer and the second ferromagnetic metal layer; and spin-orbit torque wiring that extends in a first direction intersecting with a stacking direction of the magnetoresistance effect element and that is joined to the second ferromagnetic metal layer; wherein the magnetization of the second ferromagnetic metal layer is oriented in the stacking direction of the magnetoresistance effect element; and the second ferromagnetic metal layer has shape anisotropy, such that a length along the first direction is greater than a length along a second direction orthogonal to the first direction and to the stacking direction.

(2) In the spin-orbit torque type magnetoresistance effect element according to the above-mentioned embodiment, the magnetoresistance effect element may have an elliptical region that is inscribed in a planar shape of the magnetoresistance effect element when viewed from the stacking direction, and an external region that is positioned outside the elliptical region in the first direction.

(3) In the spin-orbit torque type magnetoresistance effect element according to the above-mentioned embodiment, the magnetoresistance effect element may be rectangular when viewed from the stacking direction.

(4) In the spin-orbit torque type magnetoresistance effect element according to the above-mentioned embodiment, the length of the magnetoresistance effect element in the first direction may be not more than 60 nm.

(5) In the spin-orbit torque type magnetoresistance effect element according to the above-mentioned embodiment, when end portions of the spin-orbit torque wiring in the second direction are defined as a first end portion and a second end portion; and of the end portions of the magnetoresistance effect element in the second direction, the end portion on the side closer to the first end portion is defined as a third end portion and the end portion on the side closer to the second end portion is defined as a fourth end portion; a distance between the first end portion and the third end portion and a distance between the second end portion and the fourth end portion may both be greater than zero, and at least one of the distances may be not more than a spin diffusion length of the spin-orbit torque wiring.

(6) In the spin-orbit torque type magnetoresistance effect element according to the above-mentioned embodiment, the distance between the first end portion and the third end portion may be different from the distance between the second end portion and the fourth end portion.

(7) A method for producing a spin-orbit torque type magnetoresistance effect element according to a second embodiment is a method for producing a spin-orbit torque type magnetoresistance effect element according to the above-mentioned embodiment, the method comprising a step of forming a stacked body having the first ferromagnetic metal layer, and the non-magnetic layer and the second ferromagnetic metal layer; a step of processing the stacked body in one direction; and a step of processing the stacked body, after having been processed in the one direction, in another direction intersecting with the one direction.

(8) A method for producing a spin-orbit torque type magnetoresistance effect element according to a third embodiment is a method for producing a spin-orbit torque type magnetoresistance effect element according to the above-mentioned embodiment, the method comprising a step of forming a stacked body having the first ferromagnetic metal layer, and the non-magnetic layer and the second ferromagnetic metal layer; a step of forming, on one surface of the stacked body, a mask having a rectangular region in which an ellipse can be inscribed when viewed from the stacking direction of the stacked body, and a projecting region that is positioned at a corner or a long side of the rectangular region and that projects from the rectangular region; and a step of processing the stacked body through the mask.

Based on the spin-orbit torque type magnetoresistance effect elements according to the above-mentioned embodiments, it is possible to raise the long-term stability of magnetic recording and to reduce the amount of current necessary for magnetization reversal.

Based on the method for producing a spin-orbit torque type magnetoresistance effect element according to the above-mentioned embodiments, it is possible to easily obtain spin-orbit torque type magnetoresistance effect elements that have excellent magnetic recording properties and that only require a small amount of current for magnetization reversal.

BRIEF DESCRIPTION OF THE DRAWINGS

FIG. 8 is a schematic view for explaining the procedure for producing a rectangular magnetoresistance effect element.

DETAILED DESCRIPTION OF THE INVENTION

The present invention is described below in further detail, with reference to the drawings. The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

(Spin-orbit Torque Type Magnetoresistance Effect Element)

Figure 1:
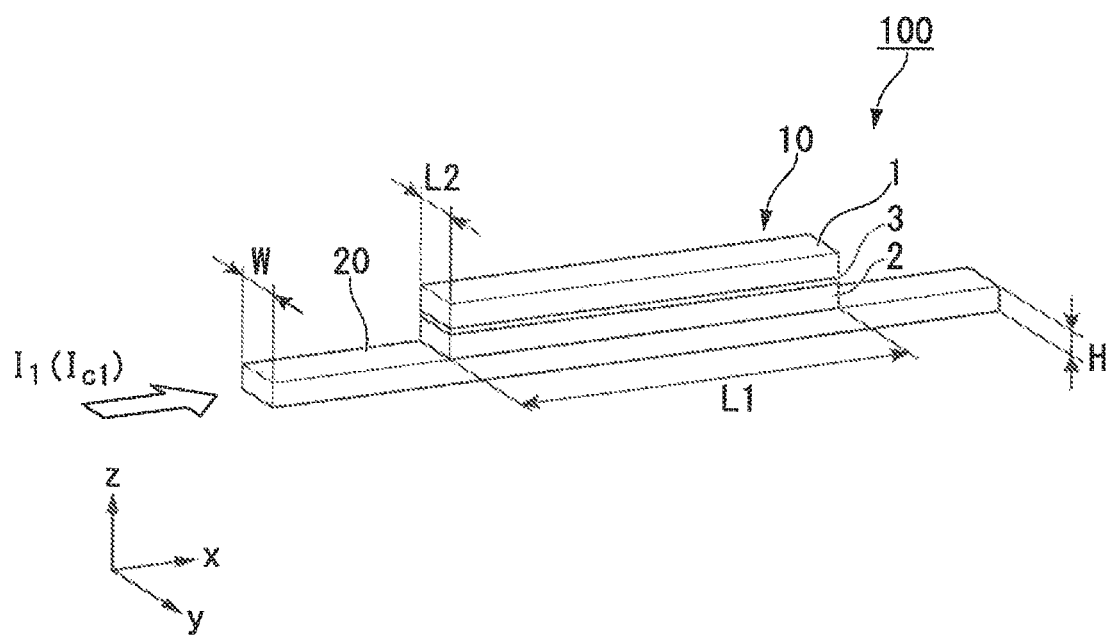
FIG. 1 is a perspective view schematically illustrating a spin-orbit torque type magnetoresistance effect element according to a first embodiment.

FIG. 1 is a perspective view schematically illustrating a spin-orbit torque type magnetoresistance effect element according to a first embodiment.

The spin-orbit torque type magnetoresistance effect element 100 according to the first embodiment has a magnetoresistance effect element 10 and spin-orbit torque wiring 20.

In the following description, the stacking direction of the magnetoresistance effect element 10 is deemed the z-direction, a first direction along which the spin-orbit torque wiring 20 extends is deemed the x-direction, a second direction which is orthogonal to both the x-direction and the z-direction is deemed the y-direction.

<Magnetoresistance Effect Element>

The magnetoresistance effect element 10 has a first ferromagnetic metal layer 1 having a fixed magnetization direction, a second ferromagnetic metal layer 2 having a variable magnetization direction, and a non-magnetic layer 3 sandwiched between the first ferromagnetic metal layer 1 and the second ferromagnetic metal layer 2.

The magnetoresistance effect element 10 functions by having the orientation of the magnetization M1 of the first ferromagnetic metal layer 1 fixed in a single direction, whereas the orientation of the magnetization M2 of the second ferromagnetic metal layer 2 is able to vary relatively. When applied to coercive force difference (pseudo spin valve) MRAM, the coercive force of the first ferromagnetic metal layer is larger than the coercive force of the second ferromagnetic metal layer, and when applied to exchange bias (spin valve) MRAM, the magnetization direction of the first ferromagnetic metal layer is fixed by exchange coupling with an antiferromagnetic layer.

When the non-magnetic layer 3 is formed from an insulator, the magnetoresistance effect element 10 is a tunneling magnetoresistance (TMR) element, whereas when the non-magnetic layer 3 is formed from a metal, the magnetoresistance effect element 10 is a giant magnetoresistance (GMR) element.

The stacking structure of the magnetoresistance effect element can employ a conventional magnetoresistance effect element stacking structure. For example, each layer may be composed of a plurality of layers, and the structure may also include other layers such as an antiferromagnetic layer for fixing the magnetization direction of the first ferromagnetic metal layer 1. The first ferromagnetic metal layer 1 is also called the fixed layer or reference layer, whereas the second ferromagnetic metal layer 2 is also called the free layer or the memory layer.

Conventional materials can be used as the material for the first ferromagnetic metal layer 1. For example, metals selected from the group consisting of Cr, Mn, Co, Fe and Ni, and alloys containing at least one of these metals and having ferromagnetism can be used. Further, alloys containing at least one of these metals and at least one element among B, C and N can also be used. Specific examples include Co—Fe and Co—Fe—B.

Further, in order to achieve higher output, a Heusler alloy such as $Co_2FeS1$ is preferably used. Heusler alloys contain intermetallic compounds having a chemical composition of $X_2YZ$, wherein X is a noble metal element or a transition metal element belonging to the Co, Fe, Ni or Cu group of the periodic table, whereas Y is a transition metal belonging to the Mn, V, Cr or Ti group of the periodic table, and can select the elemental species of X, and Z is a typical element of group III to group V. Specific examples include $Co_2FeSi$, $Co_2MnSi$, and $Co_2Mn_{1-a}Fe_aAl_bSi_{1-b}$.

Furthermore, in order to increase the coercive force of the first ferromagnetic metal layer 1 on the second ferromagnetic metal layer 2, an antiferromagnetic material such as IrMn or PtMn may be used as the material that contacts the first ferromagnetic metal layer 1. Moreover, in order to ensure that the leakage magnetic field of the first ferromagnetic metal layer 1 does not affect the second ferromagnetic metal layer 2, a structure having synthetic ferromagnetic coupling may be used.

Furthermore, in those cases where the orientation of the magnetization of the first ferromagnetic metal layer 1 is perpendicular to the stacking surface, a stacked film of Co and Pt is preferably used. Specifically, the structure of the first ferromagnetic metal layer 1 may be [FeB (1.0 nm)/Ta (0.2 nm)/[Pt (0.16 nm)/Co (0.16 nm)]$_4$ /Ru (0.9 nm) /Co (0.24 nm)/Pt (0.16 nm)]$_6$ in order from the non-magnetic layer 3.

For the material of the second ferromagnetic metal layer 2, a ferromagnetic material, and particularly a soft magnetic material, can be used. Examples of materials that can be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

The orientation of the magnetization of the second ferromagnetic metal layer 2 is z-direction (perpendicular to the stacking surface). In those cases where the orientation of the magnetization of the second ferromagnetic metal layer 2 is z-direction, the size of the magnetoresistance effect element 10 becomes small. The orientation of the magnetization of the second ferromagnetic metal layer 2 is influenced by the crystal structure constituting the second ferromagnetic metal layer 2 and the thickness of the second ferromagnetic metal layer 2. The thickness of the second ferromagnetic metal layer 2 is preferably not more than 2.5 nm. Because the perpendicular magnetic anisotropy effect is attenuated as the thickness of the second ferromagnetic metal layer 2 is increased, the thickness of the second ferromagnetic metal layer 2 is preferably kept thin.

Conventional materials can be used as the non-magnetic layer 3.

For example, when the non-magnetic layer 3 is formed from an insulator (and forms a tunnel barrier layer), examples of materials that can be used include $Al_2O_3$, $SiO_2$, MgO and $MgAl_2O_4$. In addition to these materials, materials in which a portion of the Al, S1 or Mg has been substituted with Zn or Be or the like can also be used. Among the above materials, MgO and $MgAl_2O_4$ are materials that enable the realization of coherent tunneling, and therefore enable efficient injection of spin.

Further, when the non-magnetic layer 3 is formed from a metal, examples of materials that can be used include Cu, Au, and Ag and the like.

Furthermore, the magnetoresistance effect element 10 may also have other layers. For example, the magnetoresistance effect element 10 may have a base layer on the opposite surface of the second ferromagnetic metal layer 2 from the non-magnetic layer 3, and/or may have a capping layer on the opposite surface of the first ferromagnetic metal layer 1 from the non-magnetic layer 3.

A layer disposed between the spin-orbit torque wiring 20 and the magnetoresistance effect element 10 preferably does not dissipate the spin propagated from the spin-orbit torque wiring 20. For example, silver, copper, magnesium, and aluminum and the like have a long spin diffusion length of at least 100 nm, and are known to be resistant to spin dissipation.

The thickness of this layer is preferably not more than the spin diffusion length of the material used for forming the layer. Provided the thickness of the layer is not more than the spin diffusion length, the spin propagated from the spin-orbit torque wiring 20 can be transmitted satisfactorily to the magnetoresistance effect element 10.

<Spin-Orbit Torque Wiring>

The spin-orbit torque wiring 20 extends along the x-direction. The spin-orbit torque wiring 20 is connected to one surface of the second ferromagnetic metal layer 2 in the z-direction. The spin-orbit torque wiring 20 may be connected directly to the second ferromagnetic metal layer 2, or connected via another layer.

The spin-orbit torque wiring 20 is formed from a material that generates a pure spin current by the spin Hall effect when a current flows through the material. This material may have any composition capable of generating a pure spin current in the spin-orbit torque wiring 20. Accordingly, the material is not limited to materials formed from simple elements, and may also be composed of a portion formed from a material that generates a pure spin current and a portion formed from a material that does not generate a pure spin current.

The spin Hall effect is a phenomenon wherein when an electric current is passed through a material, a pure spin current is induced in a direction orthogonal to the orientation of the electric current as a result of spin-orbit interactions.

Figure 2:
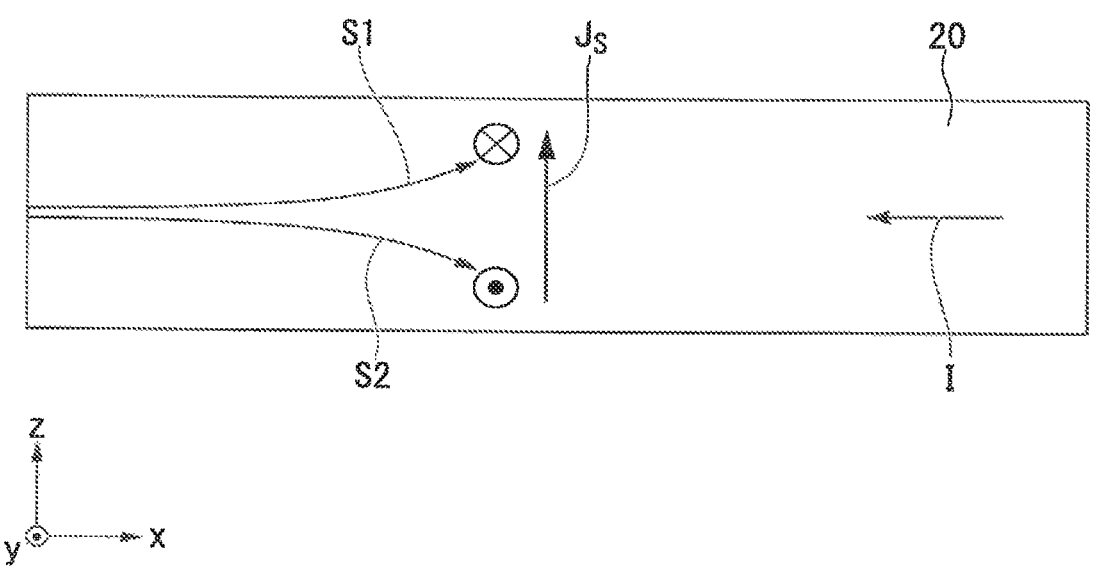
FIG. 2 is a schematic view for explaining the spin Hall effect.

FIG. 2 is a schematic diagram for explaining the spin Hall effect. FIG. 2 is a cross-sectional view of the spin orbit torque wiring 20 shown in FIG. 1 cut along the x-direction. A mechanism by which a pure spin current is generated by the spin Hall effect is described with reference to FIG. 2.

As illustrated in FIG. 2, when an electric current I flows along the direction which the spin-orbit torque wiring 20 extends, a first spin S1 oriented toward the back of the paper surface and a second spin S2 oriented toward the front of the paper surface are bent in directions orthogonal to the current. The normal Hall effect and the spin Hall effect have in common the fact that the direction of travel (movement) of the traveling (moving) electric charge (electrons) is bent, but differ significantly in terms of the fact that in the common Hall effect, charged particles moving through a magnetic field are affected by Lorentz forces, resulting in bending of the travel direction, whereas in the spin Hall effect, despite no magnetic field existing, the travel direction of the spin bends simply under the effect of the movement of the electrons (flow of current).

In a non-magnetic material (a material that is not ferromagnetic), the electron count of the first spin S1 and the electron count of the second spin S2 are equal, and therefore in FIG. 2, the electron count of the first spin S1 moved to the upward direction and the electron count of the second spin S2 moved to the downward direction are equal. Accordingly, the electric current represented by the net flux of the electric charge is zero. This type of spin current that is accompanied by no electric current is called a pure spin current.

When a current is passed through a ferromagnetic material, the fact that the first spin S1 and the second spin S2 are bent in opposite directions is the same. However, the difference in a ferromagnetic material is that one of either the first spin S1 or the second spin S2 is greater, resulting in the occurrence of a net flux for the electric charge (and the generation of a voltage). Accordingly, a material formed solely from a ferromagnetic substance cannot be used as the material for the spin-orbit torque wiring 20.

If the electron flow of the first spin S1 is represented by $J_\uparrow$, the electron flow of the second spin S2 is represented by $J_\downarrow$, and the spin current is represented by $J_S$, then the spin current is defined as $J_S=J_\uparrow-J_\downarrow$. In FIG. 2, the pure spin current $J_S$ flows in the upward direction in the figure. Here, $J_S$ is an electron flow having 100% polarizability.

In FIG. 1, when a ferromagnetic material is brought into contact with the upper surface of the spin-orbit torque wiring 20, the pure spin current diffuses and flows into the ferromagnetic material. In other words, spin is injected into the magnetoresistance effect element 10.

The spin-orbit torque wiring 20 may contain a non-magnetic heavy metal. Here, the term "heavy metal" is used to mean a metal having a specific gravity at least as large as that of yttrium. The spin-orbit torque wiring 20 may also be formed solely from a non-magnetic metal.

In such a case, the non-magnetic metal is preferably a non-magnetic metal with a large atomic number, and specifically a non-magnetic metal with an atomic number of 39 or greater having d-electrons or f-electrons in the outermost shell. The reason for this preference is that such non-magnetic metals exhibit large spin-orbit interactions that generate a spin Hall effect. The spin-orbit torque wiring 20 may also be formed solely from a non-magnetic metal with a large atomic number, having an atomic number of 39 or greater and having d-electrons or f-electrons in the outermost shell.

Typically, when a current is passed through a metal, all of the electrons move in the opposite direction of the current regardless of spin orientation, but in the case of a non-magnetic metal with a large atomic number having d-electrons or f-electrons in the outermost shell, because the spin-orbit interactions are large, the spin Hall effect greatly acts and the direction of electron movement is dependent on the electron spin orientation, meaning a pure spin current $J_S$ develops more readily.

Furthermore, the spin-orbit torque wiring 20 may contain a magnetic metal. The term "magnetic metal" means a ferromagnetic metal or an antiferromagnetic metal. By including a trace amount of a magnetic metal in the non-magnetic metal, the spin-orbit interactions can be amplified, thereby increasing the spin current generation efficiency of the electric current passed through the spin-orbit torque wiring 20. The spin-orbit torque wiring 20 may also be formed solely from an antiferromagnetic metal.

Spin-orbit interactions occur within interior field peculiar to the substance of the spin-orbit torque wiring material. Accordingly, pure spin currents also develop in non-magnetic materials. By adding a trace amount of a magnetic metal to the spin-orbit torque wiring material, because the electron spin of the magnetic metal itself is scattered, the efficiency of spin current generation is enhanced. However, if the amount added of the magnetic metal is too large, then the generated pure spin current tends to be scattered by the added magnetic metal, resulting in a stronger action reducing the spin current. Accordingly, it is preferable that the molar ratio of the added magnetic metal is considerably lower than that of the main component of the pure spin current generation portion in the spin-orbit torque wiring. As a guide, the molar ratio of the added magnetic metal is preferably not more than 3%.

Furthermore, the spin-orbit torque wiring 20 may contain a topological insulator. The spin-orbit torque wiring 20 may also be formed solely from a topological insulator. A topological insulator is a substance in which the interior of the substance is an insulator or a high-resistance body, but the surface of the substance forms a metal-like state with spin polarization. This substances have a type of internal magnetic field known as a spin-orbit interaction. Accordingly, even if an external magnetic field does not exist, the effect of these spin-orbit interactions generates a new topological phase. This is a topological insulator, which as a result of strong spin-orbit interactions and the break of inversion symmetry at the edges, is able to generate a pure spin current with good efficiency.

Examples of preferred topological insulators include SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$. These topological insulators can generate spin current with good efficiency.

The spin-orbit torque type magnetoresistance effect element 100 may also have other structural elements besides the magnetoresistance effect element 10 and the spin-orbit torque wiring 20. For example, the spin-orbit torque type magnetoresistance effect element 100 may have a substrate or the like as a support. The substrate preferably has superior smoothness, and examples of materials that can be used include Si and AlTiC.

(Principles of Spin-Orbit Torque Type Magnetoresistance Effect Element)

Next, the operating principles of the spin-orbit torque type magnetoresistance effect element 100 will be explained, together with the specific structure of the magnetoresistance effect element 10 and the relationship between the magnetoresistance effect element 10 and the spin-orbit torque wiring 20.

As illustrated in FIG. 1, when a current $I_1$ is applied to the spin-orbit torque wiring 20, a pure spin current Js (see FIG. 2) is generated in the z-direction. A magnetoresistance effect element 10 is provided in the z-direction of the spin-orbit torque wiring 20. Due thereto, spin is injected from the spin-orbit torque wiring 20 into the second ferromagnetic metal layer 2 of the magnetoresistance effect element 10. The injected spin applies a spin-orbit torque (SOT) to the magnetization of the second ferromagnetic metal layer 2, causing magnetization reversal.

The magnetization reversal of the magnetoresistance effect element 10 depends on the amount of injected spin. The amount of spin is determined by the current density $I_{c1}$ of the electric current $I_1$ flowing through the spin-orbit torque wiring 20. The current density $I_{c1}$ of the electric current $I_1$ flowing through the spin-orbit torque wiring 20 is the value of the electric current flowing through the spin-orbit torque wiring 20 divided by the area of a plane orthogonal to the direction of flow of the electric current. For this reason, in FIG. 1, the current density $I_{c1}=I_1/WH$. In this case, W represents the length (width) of the spin-orbit torque wiring 20 in the y-direction, and H represents the thickness of the spin-orbit torque wiring 20 in the z-direction.

The current density $I_{c1}$ does not include a component along the length L1 of the magnetoresistance effect element in the x-direction, and is determined by the spin-orbit torque wiring 20. This is a highly noteworthy fact. In the spin-orbit torque type magnetoresistance effect element 100, the amount of current necessary for operation can be set independently of the area (the area when viewed from the z-direction) of the magnetoresistance effect element 10.

Figure 3:
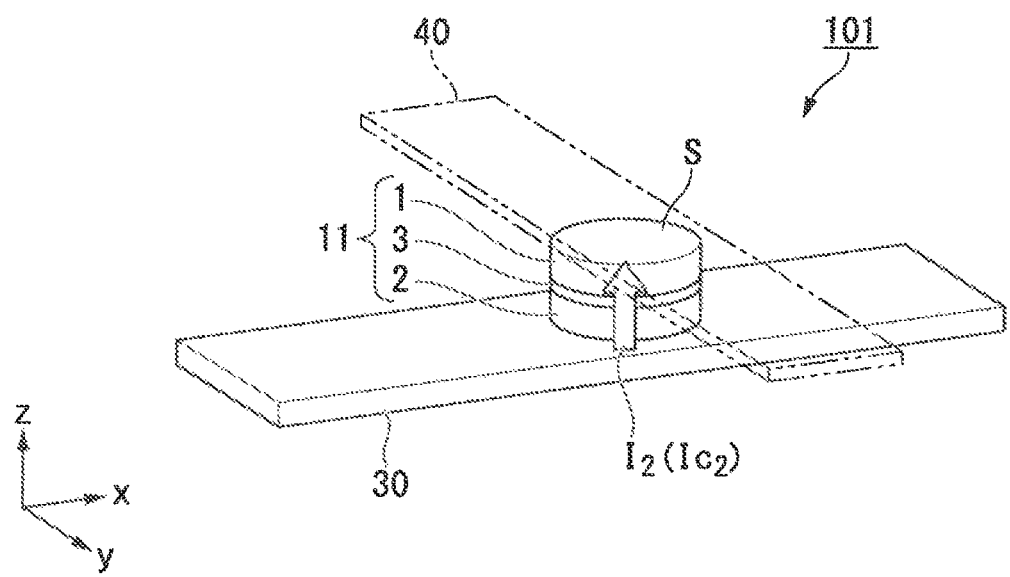
FIG. 3 is a schematic view of a spin-transfer torque type magnetoresistance effect element using STT.

FIG. 3 is a schematic view of a spin-transfer torque type magnetoresistance effect element 101 using STT. The spin-transfer torque type magnetoresistance effect element 101 comprises a magnetoresistance effect element 11, first wiring 30 and second wiring 40. Any kind of conductor may be used for the first wiring 30 and the second wiring 40.

When a potential difference is provided between the first wiring 30 and the second wiring 40, an electric current $I_2$ flows in the stacking direction of the magnetoresistance effect element 11. The electric current $I_2$ generates STT, and the magnetization of the second ferromagnetic metal layer 2 is reversed.

The intensity of the STT is determined by the current density $I_{c2}$ of the electric current $I_2$ flowing in the stacking direction of the magnetoresistance effect element 11. The current density $I_{c2}$ of the electric current $I_2$ flowing in the stacking direction of the magnetoresistance effect element 11 is the value of the electric current $I_2$ flowing in the stacking direction of the magnetoresistance effect element 11 divided by the area of a plane orthogonal to the direction of flow of the electric current (the cross-sectional area S of the magnetoresistance effect element 11). For this reason, in FIG. 3, the current density $I_{c2}=I_2/S$.

This current density $I_{c2}$ has the cross-sectional area S of the magnetoresistance effect element 11 as a parameter. For this reason, the amount of current necessary for the operation of the spin-transfer torque type magnetoresistance effect element 101 depends on the area (the area when viewed from the z-direction) of the magnetoresistance effect element 11.

If the cross-sectional area S of the magnetoresistance effect element 11 is small, then there is an increased probability that the magnetization of the second ferromagnetic metal layer 2 will be reversed under the influence of thermal disturbances or the like. For this reason, the cross-sectional area S of the magnetoresistance effect element 11 must be at least a predetermined size in order to ensure the stability of magnetic recording. In other words, in order to operate the spin-transfer torque type magnetoresistance effect element 101, a current amount obtained by multiplying the "current density necessary for magnetization reversal" with the "area for which magnetization can be stably maintained" is necessary.

In contrast, in order to operate the spin-orbit torque type magnetoresistance effect element 100 according to the present embodiment, a current amount obtained by multiplying the "current density necessary for magnetization reversal" with the "cross-sectional area of the spin-orbit torque wiring 20" is necessary. The "cross-sectional area of the spin-orbit torque wiring 20" can be set to any value. For this reason, in the spin-orbit torque type magnetoresistance effect element 100, the total amount of current necessary for operation can be made smaller.

As illustrated in FIG. 1, the second ferromagnetic metal layer 2 in the spin-orbit torque type magnetoresistance effect element 100 has shape anisotropy. The length L1 of the second ferromagnetic metal layer 2 in the x-direction is longer than the length (width) L2 in the y-direction. By configuring the spin-orbit torque type magnetoresistance effect element 100 in this way, the total amount of current necessary for operation can be made smaller. Herebelow, the reasons therefor will be explained.

Figure 4:
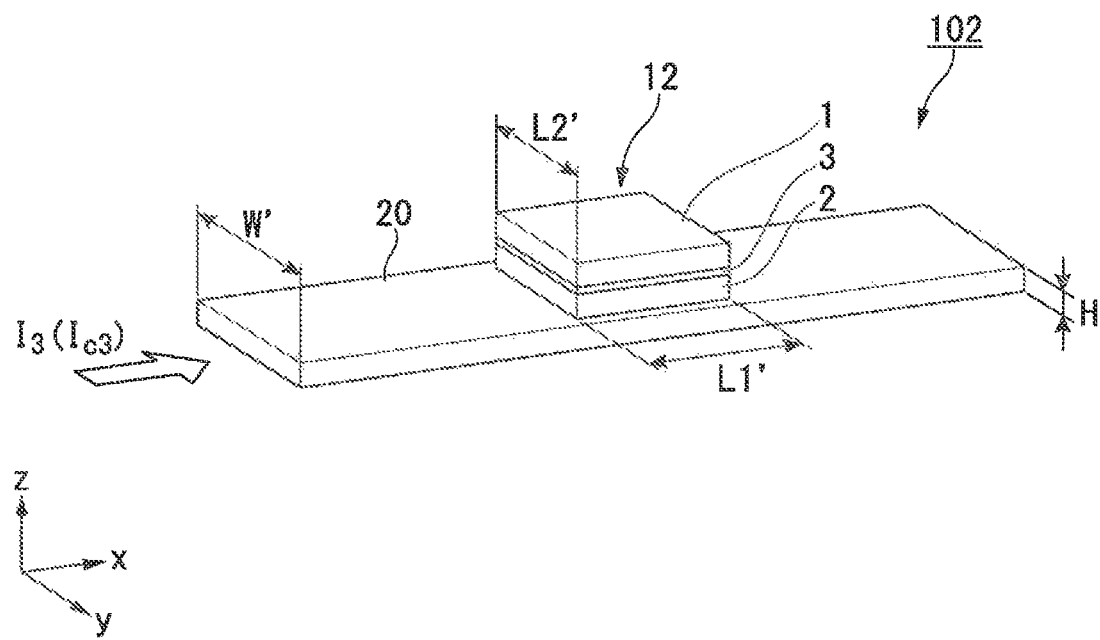
FIG. 4 is a schematic view of a spin-orbit torque type magnetoresistance effect element when the magnetoresistance effect element does not have shape anisotropy.

FIG. 4 is a schematic view of a spin-orbit torque type magnetoresistance effect element 102 when the second ferromagnetic metal layer 2 of the magnetoresistance effect element 12 does not have shape anisotropy. In the magnetoresistance effect element 12 illustrated in FIG. 4, the length L1' of the second ferromagnetic metal layer 2 in the x-direction is equal to the length (width) L2' in the y-direction. In other words, the magnetoresistance effect element 12 is square-shaped when viewed from the z-direction.

Generally speaking, when introducing elements of limited size into a limited space, elements having higher symmetry can be more efficiently placed. For this reason, in order to raise the level of integration of MRAM, it would be normal to increase the symmetry of the magnetoresistance effect elements. In other words, magnetoresistance effect elements that are highly symmetrical, i.e. square-shaped (see FIG. 4) or circular, when viewed from the z-direction, would be chosen for use as the integrated elements.

In order to operate the spin-orbit torque type magnetoresistance effect element 102, an electric current $I_3$ obtained by multiplying the "current density $I_{c3}$ necessary for magnetization reversal" with the "cross-sectional area (W'H) of the spin-orbit torque wiring 20" is necessary. In other words, the relation $I_3=I_{c3}\times W'H$ is established.

As mentioned above, in order to operate the spin-orbit torque type magnetoresistance effect element 100 illustrated in FIG. 1, an electric current $I_1$ obtained by multiplying the "current density $I_{c1}$ necessary for magnetization reversal" with the "cross-sectional area (WH) of the spin-orbit torque wiring 20" is necessary. In other words, the relation $I_{c1}=\times$ WH is established.

Since the layer structures of the magnetoresistance effect elements 10, 12 are identical, the current density $I_{c1}$ and the current density $I_{c3}$ are about the same. When considering that there is a need to make the areas of magnetoresistance effect elements the same in order to ensure thermal stability, the length L2' of the magnetoresistance effect element 12 in the y-direction must be made longer than the length L2, and in conjunction therewith, the width W' of the spin-orbit torque wiring 20 in the y-direction must also be made wider. In other words, the width W' of the spin-orbit torque type magnetoresistance effect element 102 in the y-direction is wider than the width W of the spin-orbit torque type magnetoresistance effect element 100 in the y-direction. In other words, the electric current $I_1$ that is necessary to operate the spin-orbit torque type magnetoresistance effect element 100 is lower than the electric current $I_3$ that is necessary to operate the spin-orbit torque type magnetoresistance effect element 102.

In view of the above, it is preferable for the width W of the magnetoresistance effect element 10 to be as narrow as possible. However, when considering the state of the art in processing techniques such as photolithography, 7 nm is the limit. Additionally, the thickness H of the spin-orbit torque wiring 20 is preferably as thin as possible, but the thickness should preferably be at least 10 nm in order to allow a sufficient amount of current to flow.

When the cross-sectional area of the spin-orbit torque wiring 20 is small, the resistance can be expected to become greater. However, the spin-orbit torque wiring 20 is metallic and the resistance is not expected to become so large that the operation of the element will be affected. The increase in resistance is trivial in comparison to cases in which the electric current is supplied to a tunnel barrier layer, as in TMR elements in which magnetization reversal is performed by STT.

The resistance value at the portion of the spin-orbit torque wiring 20 that overlaps with the magnetoresistance effect element 10 when viewed from the z-direction should preferably be lower than the resistance value of the magnetoresistance effect element 10. In this case, the "resistance value of the magnetoresistance effect element 10" refers to the resistance value when electric current is supplied in the z-direction of the magnetoresistance effect element. Additionally, when the magnetoresistance effect element is a TMR, most of the resistance in the magnetoresistance effect element 10 is due to the resistance in the tunnel barrier layer. By setting the resistance values to have such a relationship, it is possible to suppress the flow of the electric current $I_1$ that is supplied to the spin-orbit torque wiring 20 into the magnetoresistance effect element 10. In other words, the electric current $I_1$ supplied to the spin-orbit torque wiring 20 can be made to more efficiently contribute to the generation of pure spin current.

Additionally, there is also the advantage that, when the second ferromagnetic metal layer 2 in the magnetoresistance effect element 10 has shape anisotropy, the magnetization of the second ferromagnetic metal layer is more easily reversed. When the magnetization of the second ferromagnetic metal layer is oriented in the z-direction, magnetization rotation must be triggered in order to rotate the magnetization by SOT. The magnetization rotation may be triggered by applying an external magnetic field or the like. However, if a magnetic field generation source is provided outside the element, the overall size of the spin-orbit torque type magnetoresistance effect element 100 will become large. Therefore, the magnetization rotation may be triggered, even in an environment lacking a magnetic field, by providing the magnetoresistance effect element 10 with shape anisotropy.

When the second ferromagnetic metal layer 2 in the magnetoresistance effect element 10 has shape anisotropy, the intensity of the demagnetizing field of the magnetoresistance effect element 10 will differ between the long-axis direction (direction of length L1) and the short-axis direction (direction of length L2). In other words, there will be a distribution in the intensity of the demagnetizing field.

The demagnetizing field is a reverse-oriented magnetic field that is generated inside a ferromagnetic body by the magnetic poles formed at the ends of a magnetic body. For this reason, the intensity of the demagnetizing field becomes greater as the polarizability of the magnetic poles becomes greater and as the distance between the magnetic poles becomes smaller. In the case of the magnetoresistance effect element 10 illustrated in FIG. 1, the intensity of the demagnetizing field in the short-axis direction (direction of length L2) is greater than the intensity of the demagnetizing field in the long-axis direction (direction of length L1).

The demagnetizing field generates a restoring force that tends to return the magnetization of the second ferromagnetic metal layer to the original state when the magnetization begins to rotate. The restoring force counteracts the magnetization rotation, and as the restoring force becomes greater, it becomes more difficult to rotate the magnetization.

For this reason, the ease of rotation of the magnetization of the second ferromagnetic metal layer 2 differs between the rotation direction along the long-axis direction (hereinafter referred to as the first rotation direction) and the rotation direction along the short-axis direction (hereinafter referred to as the second rotation direction). The intensity of the restoring force that is encountered when rotating the magnetization is greater in the short-axis direction. For this reason, the magnetization is more easily rotated along the first rotation direction than along the second rotation direction. In other words, the first rotation direction is a magnetization-reversal-facilitated direction.

As illustrated in FIG. 3, the magnetoresistance effect element 12, which is square-shaped in planar view when viewed from the z-direction, does not have a magnetization-reversal-facilitated direction. Additionally, when considering that it is necessary to make the areas of magnetoresistance effect elements the same in order to ensure thermal stability, the length L1 of the magnetoresistance effect element 10 in the x-direction must be longer than the length L1' of the magnetoresistance effect element 12 in the x-direction. In other words, the energy necessary for reversing the magnetization of the magnetoresistance effect element 10 is less than the energy necessary for reversing the magnetization of the magnetoresistance effect element 12.

In this case, the length L1 of the magnetoresistance effect element 10 in the long-axis direction should preferably be at least 10 nm and not more than 60 nm, and the length L2 in the short-axis direction should preferably be smaller than L1. When the size of the magnetoresistance effect element 10 is large, magnetic domains are formed inside the second ferromagnetic metal layer 2. When magnetic domains are formed, the stability of the magnetization of the second ferromagnetic metal layer decreases. Additionally, the length of the magnetoresistance effect element 10 in the long-axis direction is preferably at least twice, more preferably at least four times, the length in the short-axis direction. If the ratio between the lengths of the magnetoresistance effect element 10 in the long-axis direction and the short-axis direction is within said range, then a sufficient difference is obtained in the restoring force due to the demagnetizing field.

Figure 5:
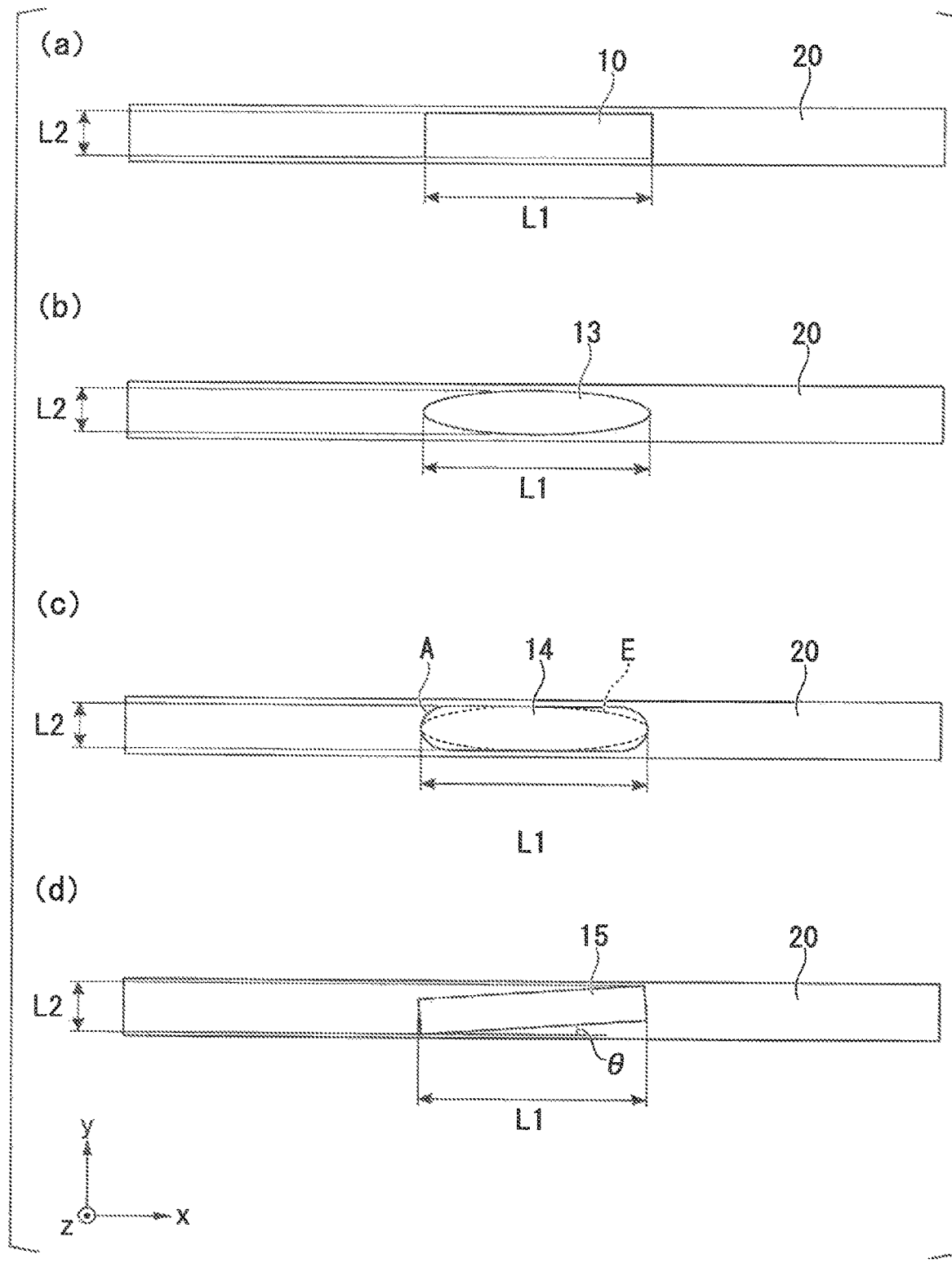
FIG. 5 is a diagram illustrating the spin-orbit torque type magnetoresistance effect element according to the present embodiment, when viewed from the z-direction.

FIG. 5 is a diagram illustrating the spin-orbit torque type magnetoresistance effect element according to the present embodiment, when viewed from the z-direction. FIG. 5(*a*) corresponds to a diagram illustrating the spin-orbit torque type magnetoresistance effect element 100 illustrated in FIG. 1, when viewed from the z-direction. There are no particular limitations on the shape of the magnetoresistance effect element as long as the length L1 in the x-direction is longer than the length (width) L2 in the y-direction. The shape may be rectangular as in the magnetoresistance effect element 10 illustrated in FIG. 5(*a*), or elliptical as in the magnetoresistance effect element 13 illustrated in FIG. 5(*b*).

As in the magnetoresistance effect element 14 illustrated in FIG. 5(*c*), the configuration may be such that the planar shape when viewed from the z-direction has an inscribed elliptical region E and external regions A on the outside, in the x-direction, of the elliptical region E. By retaining the external regions A, it is possible to make the area of the magnetoresistance effect element 14 larger. If the area of the magnetoresistance effect element 14 is made larger, the magnetization stability is increased and magnetization reversals due to thermal disturbances or the like can be avoided.

As in the magnetoresistance effect element 15 illustrated in FIG. 5(*d*), the long axis of the magnetoresistance effect element 10 may be inclined by an angle θ with respect to the direction of extension (x-direction) of the spin-orbit torque wiring 20.

As mentioned above, the magnetization-reversal-facilitated direction is formed in the long-axis direction of the magnetoresistance effect element 10. In other words, in the magnetoresistance effect element 15, the magnetization-reversal-facilitated direction has a component in the y-direction.

The spin that is generated in the spin-orbit torque wiring 20 by the spin Hall effect is aligned with the outer surface of the spin-orbit torque wiring 20. In other words, the spin injected from the spin-orbit torque wiring 20 into the magnetoresistance effect element 10 is oriented in the y-axis direction. That is, the spin most efficiently contributes to magnetization reversal of magnetization having a component in the y-direction.

In other words, due to the magnetization-reversal-facilitated direction of the magnetoresistance effect element 15 having a y-direction component, the magnetization can be strongly influenced by SOT acting in the y-direction. That is, the SOT can be made to efficiently act on the magnetization reversal, and the magnetization can be reversed without applying any external forces such as an external magnetic field.

Figure 6:
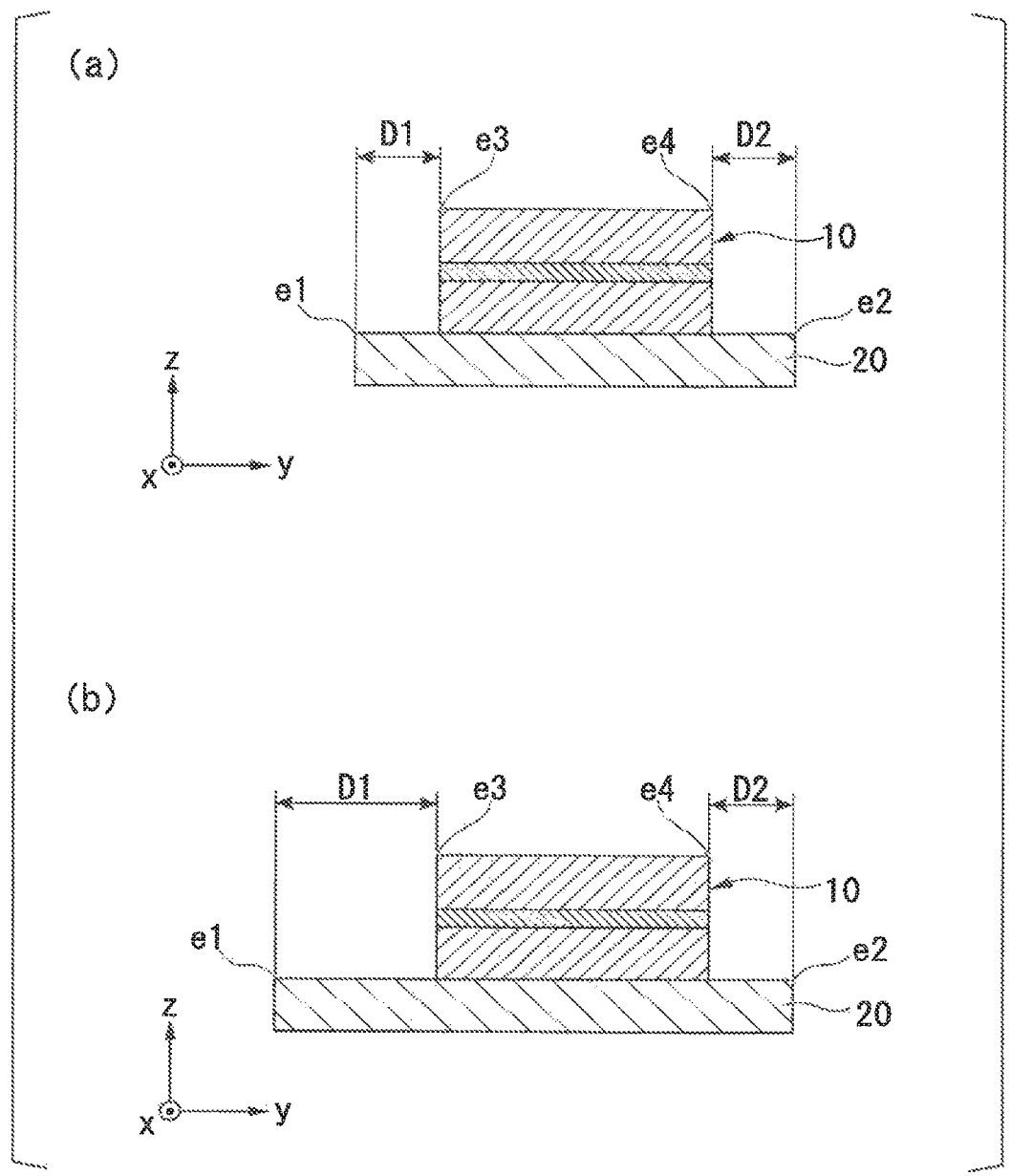
FIG. 6 is a diagram illustrating the spin-orbit torque type magnetoresistance effect element according to the present embodiment, when viewed from the x-direction.

FIG. 6 is a diagram illustrating the spin-orbit torque type magnetoresistance effect element according to the present embodiment, when viewed from the x-direction. FIG. 6(*a*) corresponds to a diagram illustrating the spin-orbit torque type magnetoresistance effect element 100 illustrated in FIG. 1 when viewed from the x-direction. In FIG. 6(*a*), the distance between the end portions of the spin-orbit torque wiring 20 and the magnetoresistance effect element 10 in the y-direction is the same at both sides. In other words, the following relationship is established.

The two end portions of the spin-orbit torque wiring 20 in the y-direction are referred to as the first end portion e1 and the second end portion e2. Additionally, the two end portions of the magnetoresistance effect element 10 in the y-direction are referred to as the third end portion e3 and the fourth end portion e4. The third end portion e3 is the end portion on the same side as the first end portion e1, and the fourth end portion e4 is the end portion on the same side as the second end portion e2. The distance D1 between the first end portion e1 and the third end portion e3 is equal to the distance D2 between the second end portion e2 and the fourth end portion e4.

The distance D1 between the first end portion e1 and the third end portion e3 and the distance D2 between the second end portion e2 and the fourth end portion e4 are both greater than zero, and preferably, at least one of the distances is not more than the spin diffusion length of the spin-orbit torque wiring 20.

When an electric current is supplied to the spin-orbit torque wiring 20, a pure spin current is generated between the first end portion e1 and the third end portion e3 and between the second end portion e2 and the fourth end portion e4. The spin that is generated in these regions can propagate within a distance range that is not more than the spin diffusion length. For this reason, if the distance D1 between the first end portion e1 and the third end portion e3 and the distance D2 between the second end portion e2 and the fourth end portion e4 are greater than zero, then the spin generated in these regions can also be used for magnetization rotation. Additionally, if these distances are not more than the spin diffusion length of the spin-orbit torque wiring 20, then the generated spin can all be used for magnetization reversal.

Additionally, FIG. 6(*b*) is a diagram illustrating another example of the spin-orbit torque type magnetoresistance effect element according to the present embodiment, when viewed from the x-direction. In FIG. 6(*b*), the distance D1 between the first end portion e1 and the third end portion e3 is greater than the distance D2 between the second end portion e2 and the fourth end portion e4. In other words, the distance D1 between the first end portion e1 and the third end portion e3 is different from the distance D2 between the second end portion e2 and the fourth end portion e4.

The total amount of spin generated between the first end portion e1 and the third end portion e3 is greater than the total amount of spin generated between the second end portion e2 and the fourth end portion e4. If the generated spin is all supplied to the magnetoresistance effect element 10, then the amount of spin supplied to the side of the magnetoresistance effect element 10 having the third end portion e3 will be greater than the amount of spin supplied to the side having the fourth end portion e4. In other words, the symmetry in the intensity of the SOT in the y-direction for rotating the magnetization of the magnetoresistance effect element 10 will be disrupted.

As mentioned above, the spin that is injected from the spin-orbit torque wiring 20 into the magnetoresistance effect element 10 is oriented in the y-axis direction. In other words, the spin most efficiently contributes to magnetization reversal having a component in the y-direction. For this reason, if the symmetry in the intensity of the SOT that is applied for the magnetization of the magnetoresistance effect element 10 in the y-direction is disrupted, then magnetization reversal is made easier. As a result thereof, the SOT acts efficiently for magnetization reversal, and the magnetization can be reversed even without applying an external force such as an external magnetic field.

With the spin-orbit torque type magnetoresistance effect element according to the present embodiment, the total amount of the electric current necessary for operation can be made smaller. For this reason, when integrated elements are connected to a power supply having a predetermined capacity, the electric current can be distributed to a larger number of elements.

Additionally, in the spin-orbit torque type magnetoresistance effect element according to the present embodiment, there is no need to supply electric current in the stacking direction of the magnetoresistance effect element. Thus, the operating life of the magnetoresistance effect element can be made longer.

Additionally, in the spin-orbit torque type magnetoresistance effect element according to the present embodiment, a distribution in the demagnetizing field occurs in conjunction with the shape anisotropy of the magnetoresistance effect element. As a result thereof, a magnetization-reversal-facilitated direction is formed in the magnetoresistance effect element, and the magnetization can be easily reversed.

(Method for Producing Spin-Orbit Torque Type Magnetoresistance Effect Element)

Next, the method for producing the spin-orbit torque type magnetoresistance effect element will be explained.

A spin-orbit torque type magnetoresistance effect element can be obtained by using a film deposition technique such as sputtering and a shape processing technique such as photolithography.

First, spin-orbit torque wiring is fabricated on a substrate forming a support. The metal constituting the spin-orbit torque wiring is deposited by a publicly known film deposition means such as sputtering. Next, a technique such as photolithography is used to process the spin-orbit torque wiring into a predetermined shape. Portions other than the spin-orbit torque wiring are covered by an insulating film such as an oxide film. The exposed surfaces of the spin-orbit torque wiring and the insulating film should preferably be polished by means of chemical-mechanical polishing (CMP).

Next, the magnetoresistance effect element is fabricated. The magnetoresistance effect element can be fabricated using a publicly known film deposition means such as sputtering. If the magnetoresistance effect element is a TMR element, then a tunnel barrier layer can be formed, for example, by first sputtering approximately 0.4 to 2.0 nm of magnesium, aluminum and a metal thin-film that forms divalent cations with multiple non-magnetic elements onto the second ferromagnetic metal layer, causing plasma oxidation or natural oxidation by feeding oxygen, and thereafter performing a heat treatment. The film deposition method may, aside from sputtering, be vapor deposition, laser ablation or MBE.

As the method for forming the magnetoresistance effect element into a predetermined shape, a processing means such as photolithography may be used. First, after forming the magnetoresistance effect element, a resist is applied to the surface of the magnetoresistance effect element on the side opposite from the spin-orbit torque wiring. Next, the resist is cured at a predetermined portion and the unnecessary parts of the resist are removed. The cured portion of the resist forms a protective film on the magnetoresistance effect element. The cured portion of the resist has the same shape as the magnetoresistance effect element that is finally obtained.

Additionally, the surface on which the protective film is formed is processed by a technique such as ion milling or reactive ion etching (RIE). The portion on which the protective film is not formed is removed, resulting in a magnetoresistance effect element of a predetermined shape.

The method for curing the resist in the predetermined shape will be explained in detail.

As a first method, there is a method of sensitizing the resist to light using a mask. For example, a positive resist is used to form a photomask on the portion that is to be cured. By exposing the resist to light through the photomask, the resist can be processed to a predetermined shape.

Figure 7:
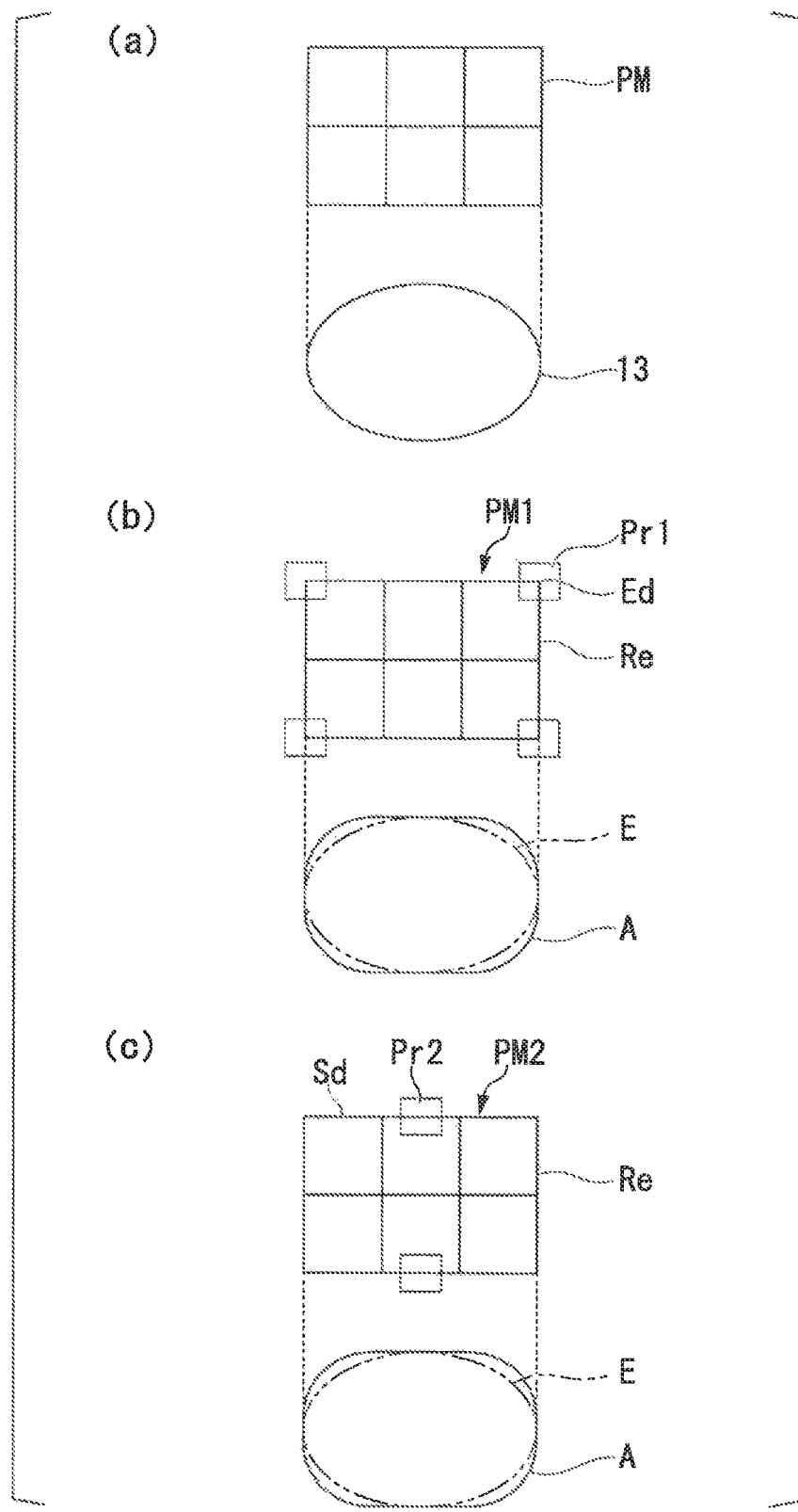
FIG. 7 is a diagram illustrating the correspondence between the shape of a photomask and the planar shape of the resulting magnetoresistance effect element when viewed from the z-direction.

There is a demand for reducing the element size of magnetoresistance effect elements in order to allow higher integration. For this reason, the size of magnetoresistance effect elements may approach the resolution limit that is possible with light exposure. In this case, as illustrated in FIG. 7, multiple photomasks PM that have been processed into rectangular shapes are combined to cure the resist in the predetermined shape. In the current state of the art, one side of one photomask PM may be made as small as approximately a few nm.

FIG. 7 is a diagram illustrating the correspondence between the shape of a photomask PM and the planar shape of the resulting magnetoresistance effect element 13, when viewed from the z-direction. As illustrated in FIG. 7(a), even when the shape of one photomask PM is rectangular, the planar shape of the magnetoresistance effect element 13 becomes elliptical or the like. This is because some of the light that has passed through the photomask PM is scattered and cures the resist. Additionally, in etching processes such as ion milling, etching proceeds more easily in the areas forming corners.

When external regions A are to be formed outside an elliptical region E as illustrated in FIG. 5(c), the photomask is shaped as shown in FIG. 7(b) and FIG. 7(c). The photomask PM1 illustrated in FIG. 7(b) has a rectangular region Re in which the ellipse can be inscribed, and projecting regions Prl at the corners Ed of the rectangular region Re. Additionally, the photomask PM2 illustrated in FIG. 7(c) has a rectangular region Re in which the ellipse can be inscribed, and projecting regions Pr2 on the long sides Sd of the rectangular region Re. The rectangular regions Re in FIG. 7(b) and (c) correspond to the photomask illustrated in FIG. 7(a).

By providing projecting regions Prl at the corners Ed as illustrated in FIG. 7(b), it is possible to delay the progress in the etching of the corners Ed during the etching process. As a result thereof, external regions A can be formed as illustrated in FIG. 5(c). Additionally, by providing projecting regions Pr2 on the sides Sd as illustrated in FIG. 7(c), the etching rate difference between the sides Sd and the corners Ed during the etching process can be made larger. As a result thereof, external regions A can be formed as shown in FIG. 5(c).

As another method, spot exposure can be performed by using light having directionality, such as a laser. For example, a negative resist is used, and light is shone only at the portions that are to be cured, thereby processing the resist into a predetermined shape. In this case as well, even if the shape of the spot that is exposed is rectangular, the resulting shape will be elliptical.

As mentioned above, even if the shape of the photomask PM is rectangular, the shape of the magnetoresistance effect element 13 will be a shape not having straight edges, such as an ellipse. For this reason, modifications are needed if the planar shape of the magnetoresistance effect element 10 when viewed from the z-direction is to be made rectangular, as illustrated in FIG. 5(a).

When the planar shape of the magnetoresistance effect element 10 is to be made rectangular when viewed from the z-direction, the magnetoresistance effect element 10 is processed in two steps. In other words, the process is divided into a first step of processing a stacked body having the first ferromagnetic metal layer, and the non-magnetic layer and the second ferromagnetic metal layer in one direction, and a second step of processing the stacked body, after having been processed in the one direction, in another direction that intersects with the one direction.

FIG. 8 is a schematic view for explaining the procedure for fabricating a rectangular magnetoresistance effect element. As illustrated in FIG. 8(a), a second ferromagnetic metal layer 2, a non-magnetic layer 3 and a first ferromagnetic metal layer 1 are sequentially stacked onto one surface of spin-orbit torque wiring 20 and an insulator 50, resulting in a stacked body.

Next, the resulting stacked body is processed in one direction. Any direction may be chosen as the one direction. For example, it may be the x-direction in which the spin-orbit torque wiring 20 extends, it may be the y-direction orthogonal to the x-direction, or it may be a direction that is oblique with respect to both the x-direction and the y-direction.

The stacked body may be processed by using a publicly known processing means, such as a method using photolithography, or a method using a laser or the like. The stacked body, after processing, has some length in the one direction, and thus can directly reflect the shape of the photomask or the like. In other words, the stacked body can be processed into a straight line in the x-direction.

Next, the resulting stacked body is processed in another direction. Any direction intersecting with the one direction may be chosen as the other direction. In FIG. 8(c), the stacked body is processed in the y-direction that is orthogonal to the x-direction in which the spin-orbit torque wiring 20 extends.

The processing in the other direction may also be performed using a publicly known processing means, such as a method using photolithography, or a method using a laser or the like. It is also possible to use a photomask or the like having some length in the other direction when processing the stacked body in the other direction, so the shape of the photomask or the like can thus be directly reflected in the shape after processing. In other words, the stacked body can be processed into a straight line in the y-direction.

Thus, by processing the stacked body in two steps, it is possible to make the planar shape of the magnetoresistance effect element 10 rectangular when viewed from the z-direction.

Additionally, the outer surface of the resulting magnetoresistance effect element 10 may be covered by an insulator. The insulator may be a publicly known insulator such as an oxide film, a nitride film or the like.

A method for fabricating the spin-orbit torque wiring and the magnetoresistance effect element sequentially has been explained to this point. On the other hand, it is also possible to fabricate the spin-orbit torque wiring and the magnetoresistance effect element at the same time.

First, the metal layer constituting the spin-orbit torque wiring and the layers constituting the magnetoresistance effect element are sequentially stacked onto a surface. Next, the spin-orbit torque wiring and the magnetoresistance effect element are processed together by means of photolithography. In a single process, the processing of the spin-orbit torque wiring and the magnetoresistance effect element in a first direction is completed simultaneously. Thereafter, by processing the magnetoresistance effect element in a second direction different from the first direction, a spin-orbit torque type magnetoresistance effect element is obtained.

The present invention is not necessarily limited to the structures and production methods of the spin-orbit torque type magnetoresistance effect element according to the above-described embodiments, and it is possible to make various modifications within a range not departing from the spirit of the present invention.

(Integration Properties of Spin-Orbit Torque Type Magnetoresistance Effect Element)

Next, the integration properties of the spin-orbit torque type magnetoresistance effect element according to the present embodiment will be explained.

<Circuit Structure>

Figure 9:
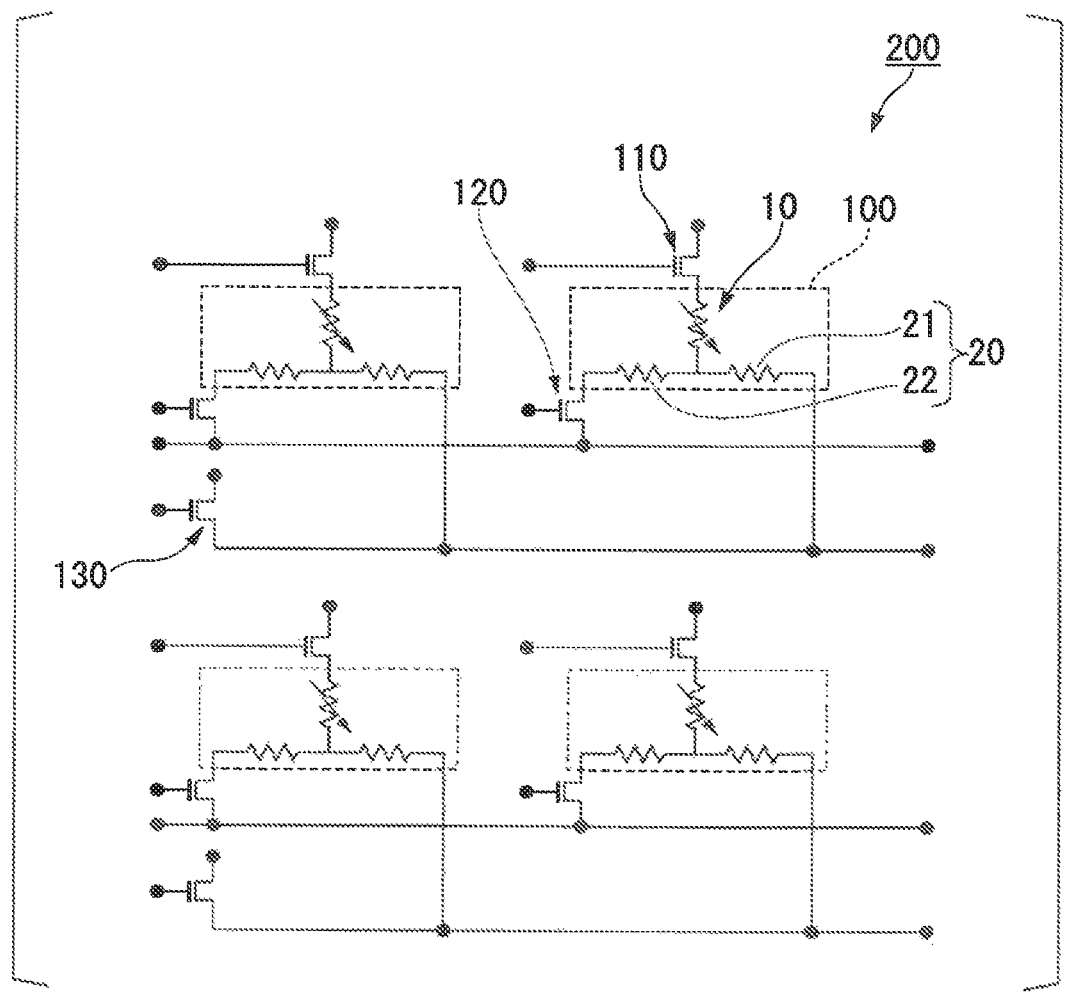
FIG. 9 is a diagram schematically illustrating an integrated circuit in which a plurality of the spin-orbit torque type magnetoresistance effect elements according to the present embodiment are integrated.
Figure 10:
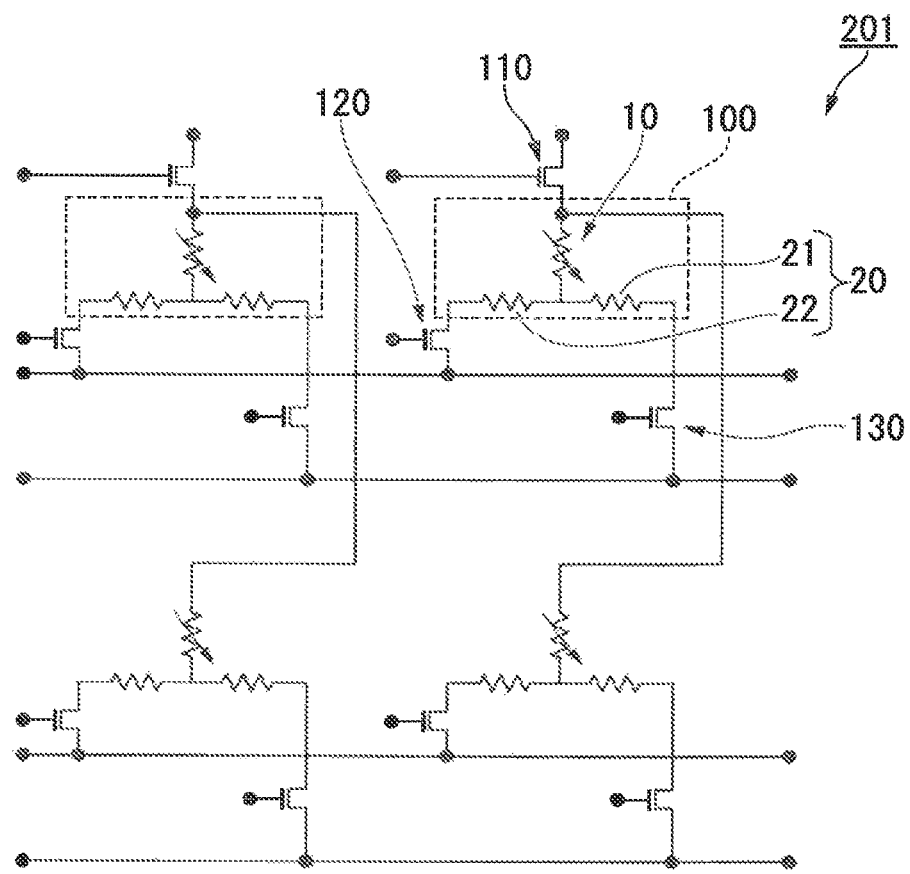
FIG. 10 is a diagram schematically illustrating an integrated circuit in which a plurality of the spin-orbit torque type magnetoresistance effect elements according to the present embodiment are integrated.

FIG. 9 and FIG. 10 are diagrams schematically illustrating integrated circuits in which a plurality of spin-orbit torque type magnetoresistance effect elements 100 are integrated. The integrated circuit 200 illustrated in FIG. 9 and the integrated circuit 201 illustrated in FIG. 10 both have only slight current leakage during writing and reading, and the circuits function satisfactorily as elements. In the circuits in FIG. 9 and FIG. 10, the spin-orbit torque wiring 20 is denoted as resistances 21 and 22.

In the integrated circuit 200 illustrated in FIG. 9 and the integrated circuit 201 illustrated in FIG. 10, a read control element 110, an element selection control element 120 and a write control element 130 are connected to one spin-orbit torque type magnetoresistance effect element 100. As these control elements, publicly known transistors or the like, such as FETs (field-effect transistors) are used.

When a read control element 110 and an element selection control element 120 are activated (switched to the "ON" state), an electric current can be supplied in the stacking direction of the magnetoresistance effect element 10, and changes in the resistance value of the magnetoresistance effect element 10 can be read. Additionally, when a write control element 130 and an element selection control element 120 are activated (switched to the "ON" state), an electric current can be supplied to the spin-orbit torque wiring 20, and the magnetization of the second ferromagnetic metal layer 2 in the magnetoresistance effect element 10 can be reversed (written).

In the integrated circuit 200 illustrated in FIG. 9, the write control elements 130 span across multiple spin-orbit torque type magnetoresistance effect elements 100, and can be provided together on an end portion of the integrated circuit board or the like. In other words, in the integrated circuit 200 illustrated in FIG. 9, the write control elements 130 do not have much influence on the integration properties of the spin-orbit torque type magnetoresistance effect element 100.

Similarly, in the integrated circuit 201 illustrated in FIG. 10, the read control elements 110 span across multiple spin-orbit torque type magnetoresistance effect elements 100, and can be provided together on an end portion of the integrated circuit board or the like. In other words, the read control elements 110 do not have much influence on the integration properties of the spin-orbit torque type magnetoresistance effect element 100.

Therefore, a single unit cell that affects the integration properties of the integrated circuit can be considered to be formed by a single spin-orbit torque type magnetoresistance effect element 100 and two control elements. The two control elements are the read control element 110 and the element selection control element 120 in the integrated circuit 200 illustrated in FIG. 9, and the element selection control element 120 and the write control element 130 in the integrated circuit 201 illustrated in FIG. 10.

Conventionally, it was thought that three control elements are necessary for each spin-orbit torque type magnetoresistance effect element 100 using SOT. However, depending on the arrangement, it is possible to reduce the number of control elements affecting the integration properties to two.

<Consideration of Unit Cell Size>

Next, the size of a single unit cell will be considered. A single unit cell is defined by one spin-orbit torque type magnetoresistance effect element 100 and two control elements. For this reason, the manner in which these elements are to be arranged is an important problem. Additionally, it is necessary to estimate the element sizes that are necessary for appropriately operating the spin-orbit torque type magnetoresistance effect element 100 and the two control elements.

Additionally, the respective element sizes necessary for appropriately operating the spin-orbit torque type magnetoresistance effect element 100 and the two control elements will be estimated.

(Spin-Orbit Torque Type Magnetoresistance Effect Element Size)

In SRAM (Static Random Access Memory) using spin-transfer torque (Hereinafter referred to as "STT-SRAM"), as one example, cylindrical magnetoresistance effect elements having a diameter of 90 nm are used. In this case, the cross-sectional area of a magnetoresistance effect element when viewed from the stacking direction is $(90/2)^2 \times = 6361$ nm$^2$. Magnetoresistance effect elements having cross-sectional areas of this size can stably retain data for 10 years even when subjected to influences such as thermal disturbances.

The cross-sectional area of a magnetoresistance effect element that is necessary for stably retaining data is also about the same for the spin-orbit torque type magnetoresistance effect element 100 according to the present embodiment. For this reason, when a magnetoresistance effect element is viewed from the stacking direction, a cross-sectional area of approximately 6300 nm$^2$ is necessary. This cross-sectional area corresponds to the value of the "length L1 in the x-direction" multiplied by the "length L2 in the y-direction" in FIG. 1.

The length L1 in the x-direction and the length L2 in the y-direction can be set to any value. Currently, the smallest processing size (feature size: F) that is possible in a semiconductor is considered to be 7 nm. For this reason, the length L2 in the y-direction must be, at minimum, 7 nm, in which case the length in the x-direction would be 900 nm. Other values could also be set for the length L1 in the x-direction and the length L2 in the y-direction, as shown in Table 1 below. In all cases, "length L2 in the y-direction"× "length L1 in the x-direction"≈6300 nm$^2$, and data can be stably retained.

On the other hand, in order to allow use as a memory element, the data must be capable of being rewritten.

In order to reverse the magnetization of (rewrite the data in) a magnetoresistance effect element in STT-SRAM, a current amount obtained by multiplying the "cross-sectional area of the magnetoresistance effect element" with the "current density necessary for magnetization reversal" is necessary. For example, if the current amount is 400 µA, then the current density that is necessary for magnetization reversal is 400 µA/6361 nm$^2$=6.2×10$^6$ A/cm$^2$.

In order to rewrite the data in the spin-orbit torque type magnetoresistance effect element 100 according to the present embodiment, an electric current value obtained by multiplying the "current density necessary for magnetization reversal" with the "cross-sectional area (WH) of the spin-orbit torque wiring 20" is necessary.

Since the cross-sectional areas of the magnetoresistance effect elements are the same, the "current density necessary for magnetization reversal" will not significantly differ from the current density that is necessary for magnetization reversal of the magnetoresistance effect elements in STT-SRAM. In other words, it may be $6.2 \times 10^6$ A/cm$^2$.

The "cross-sectional area (WH) of the spin-orbit torque wiring 20" is determined as follows. The width W of the spin-orbit torque wiring 20 must be at least the length L2 of the magnetoresistance effect element 10 in the y-direction. The thickness H of the spin-orbit torque wiring 20 must be approximately 10 nm in order to supply enough electric current, although this depends also on the width W of the spin-orbit torque wiring 20.

In other words, the minimum electric current that is necessary to rewrite the data in the spin-orbit torque type magnetoresistance effect element 100 according to the present embodiment is a value obtained by multiplying the "length L2 in the y-direction (=width W of the spin-orbit torque wiring 20)" and the "thickness H of the spin-orbit torque wiring 20" with the "current density necessary for magnetization reversal".

Table 1 shows the current amounts that are necessary in the magnetoresistance effect element 10 for different lengths L1 in the x-direction and lengths L2 in the y-direction. All of the current amounts are values that are well short of the 400 μA that are necessary for magnetization reversal in STT-SRAM having the same level of data retention performance.

electrode S and the drain electrode D are fixed at the minimum processing size F, then a predetermined current amount per unit width Wa that can be supplied between the source electrode S and the drain electrode D can be determined. When the unit width is 1 μm, an example of the predetermined current amount would be 0.5 mA. In this case, if the reversal current that is necessary for magnetization reversal is 4 μA as in Example 1 shown in Table 1, then the width Wc of the control element must be at least 8 μm. Table 1 also shows the widths Wc of the control element that are necessary in other examples.

As mentioned above, it is possible to estimate the respective element sizes that are necessary for appropriately operating a spin-orbit torque type magnetoresistance effect element 100 and two control elements T. Next, the manner in which one spin-orbit torque type magnetoresistance effect element 100 and two control elements T are to be arranged will be considered.

Element Arrangement: First Arrangement

Figure 12:
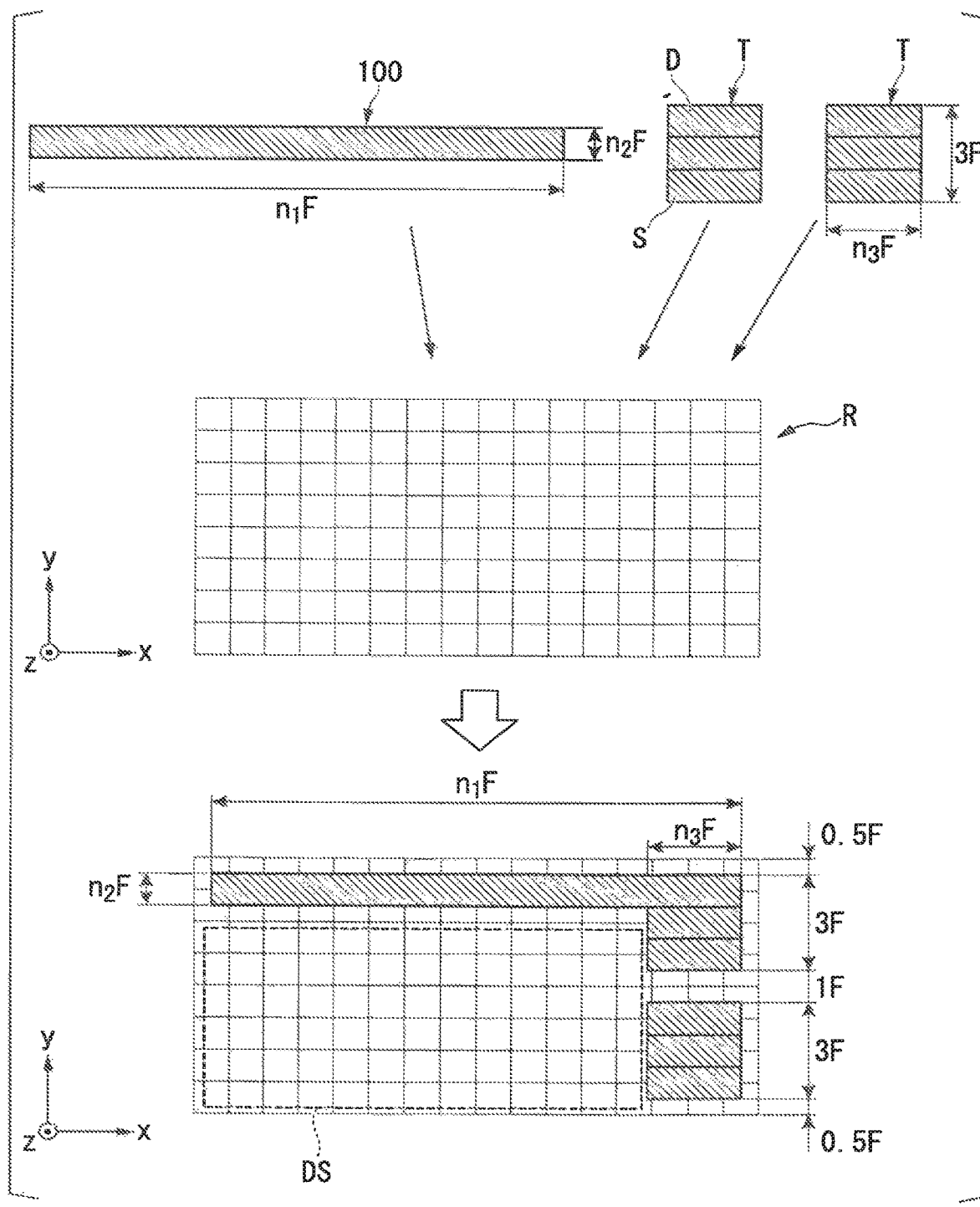
FIG. 12 is a diagram for explaining the cell size necessary for arranging one spin-orbit torque type magnetoresistance effect element and two control elements.

FIG. 12 is a diagram for explaining the cell size necessary for arranging one spin-orbit torque type magnetoresistance effect element and two control elements.

Expressing the size of the spin-orbit torque type magnetoresistance effect element 100 in terms of the minimum processing size, the length L1 in the x-direction is $n_1F$ and the length L2 in the y-direction is $n_2F$. Although $n_1$ and $n_2$ are designable values, they are correlated as shown in Table 1.

TABLE 1

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | Integrated |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area (nm$^2$) | Reversal Current (μA) | FET Width (nm) | By Minimum Processing Size ($n_3F$) | Circuit Cell Area (F$^2$) |
| Example 1 | 7 | 1F | 900 | 129F | 7 | 10 | 70 | 4.3 | 8.68 | 2F | 1056 |
| Example 2 | 14 | 2F | 450 | 65F | 14 | 10 | 140 | 8.7 | 17.36 | 3F | 544 |
| Example 3 | 21 | 3F | 300 | 43F | 21 | 10 | 210 | 13.0 | 26.04 | 4F | 368 |
| Example 4 | 28 | 4F | 225 | 33F | 28 | 10 | 280 | 17.4 | 34.72 | 5F | 288 |
| Example 5 | 35 | 5F | 180 | 26F | 35 | 10 | 350 | 21.7 | 43.4 | 7F | 232 |
| Example 6 | 42 | 6F | 150 | 22F | 42 | 10 | 420 | 26.0 | 52.08 | 8F | 200 |
| Example 7 | 49 | 7F | 129 | 19F | 49 | 10 | 490 | 30.4 | 60.76 | 9F | 176 |
| Example 8 | 56 | 8F | 113 | 17F | 56 | 10 | 560 | 34.7 | 69.44 | 10F | 160 |
| Example 9 | 63 | 9F | 100 | 15F | 63 | 10 | 630 | 39.1 | 78.12 | 12F | 144 |
| Example 10 | 70 | 10F | 90 | 13F | 70 | 10 | 700 | 43.4 | 86.8 | 13F | 128 |
| Example 11 | 77 | 11F | 82 | 12F | 77 | 10 | 770 | 47.7 | 95.48 | 14F | 136 |

Size of Control Elements

On the other hand, the electric current necessary for magnetization reversal is controlled by means of the respective control elements. In other words, each control element must have the ability to supply the electric current necessary for magnetization reversal. In other words, the element size necessary for each control element can be estimated from the current amount necessary for magnetization reversal.

Figure 11:
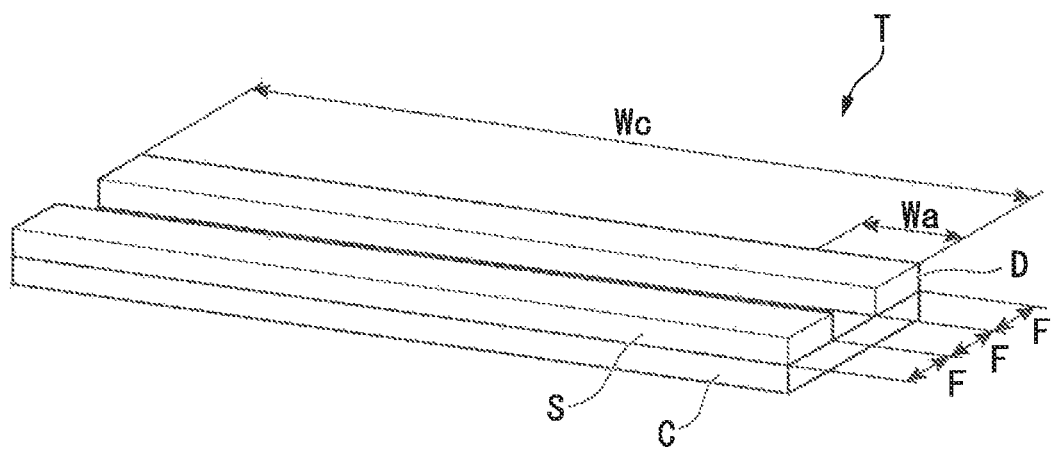
FIG. 11 is a schematic perspective view illustrating a main portion of a control element used in a spin-orbit torque type magnetoresistance effect element according to the present embodiment.

FIG. 11 is a schematic perspective view illustrating a main portion of a control element used in the spin-orbit torque type magnetoresistance effect element according to the present embodiment. Since the same element may be used for the read control element 110, the element selection control element 120 and the write control element 130, the element shall be explained herebelow as the control element T. As illustrated in FIG. 11, the control element T comprises a source electrode S, a drain electrode D and a channel C. If the width of the source electrode S, the width of the drain electrode D and the distance between the source On one hand, the length of one side of a control element T must be 3F in order to be able to accommodate the width of the source electrode, the width of the drain electrode and the channel region between the source electrode and the drain electrode. On the other hand, the length $n_3F$ of the other side is determined by the current amount to be supplied to the channel C (see Table 1).

These elements are disposed inside a predetermined region R. The spin-orbit torque type magnetoresistance effect element 100 and the control elements T do not need to be processed so as to be on the same plane, and they may overlap when viewed from the z-direction. In contrast, the control elements T are arranged in parallel in the y-direction in order to route the wiring or the like.

Figure 13:
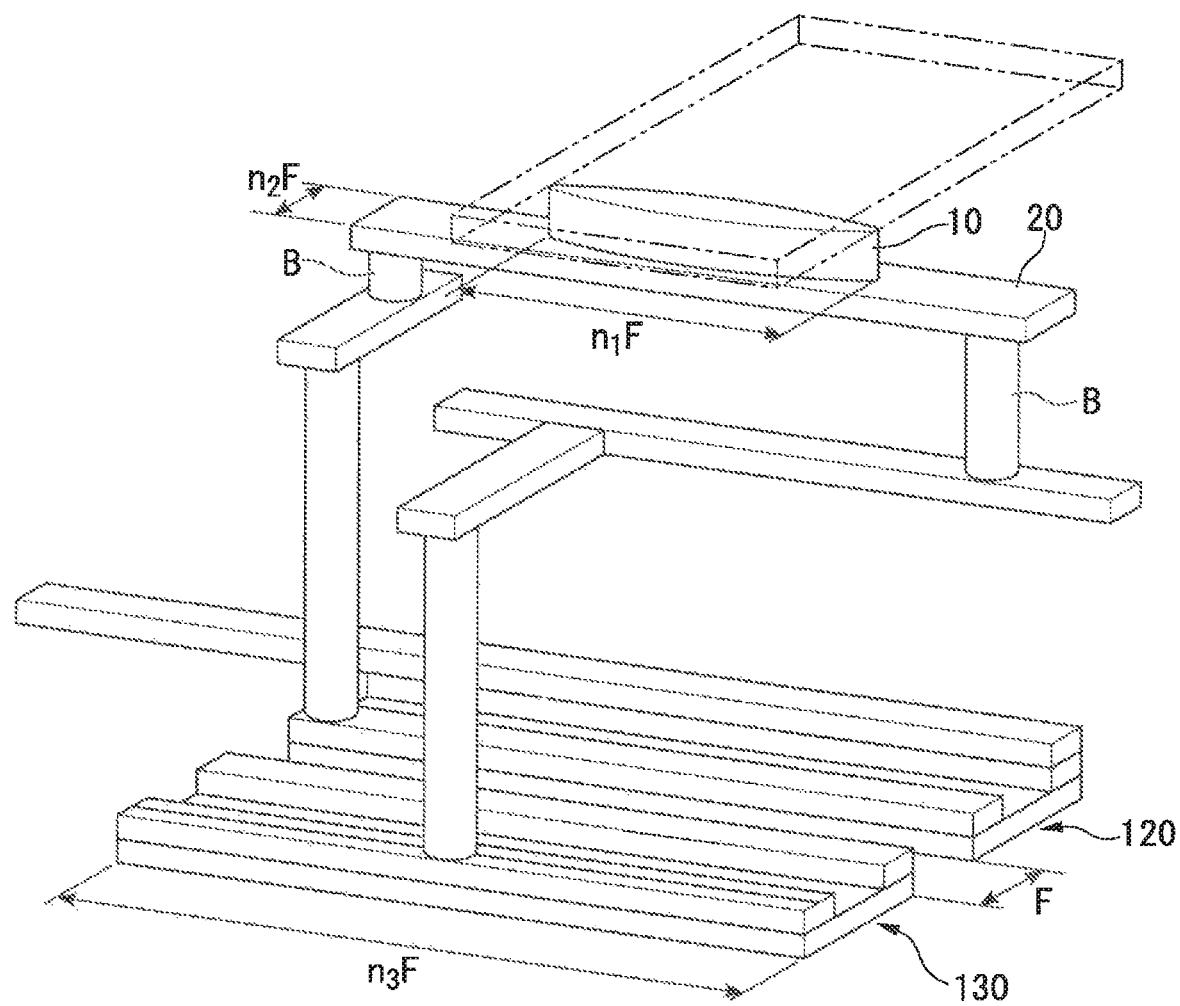
FIG. 13 is a schematic perspective view illustrating the element structure of a unit cell when one spin-orbit torque type magnetoresistance effect element and two control elements are arranged in accordance with the arrangement in FIG. 12.

FIG. 13 is a schematic perspective view illustrating the element structure of a unit cell when one spin-orbit torque type magnetoresistance effect element and two control elements are arranged in accordance with the arrangement in FIG. 12. In FIG. 13, an element selection control element 120 and a write control element 130 are incorporated as the control elements in a unit cell, and the structure is in accordance with the circuit diagram in FIG. 10. As illustrated in FIG. 13, the wiring that connects the three control elements is routed without resulting in any short circuits. In other words, it can be seen that the arrangement of the control elements illustrated in FIG. 12 is also possible when taking the three-dimensional structure into account. It was also confirmed that a three-dimensional structure is possible when following the circuit diagram in FIG. 9 (not shown in perspective).

As illustrated in FIG. 12 and FIG. 13, a space is needed between adjacent elements that are present on the same plane in order to avoid short circuits between the elements. This space must have a gap of at least the minimum processing size F. In other words, a width of at least 8F is necessary in the y-direction for a unit cell in the integrated circuit.

In the x-direction of the unit cell in the integrated circuit, the size must be at least as large as either the length ($n_1F$) of the spin-orbit torque type magnetoresistance effect element 100 in the x-direction or the length ($n_3F$) of the control element T in the x-direction. In actual practice, a space (2F) for fabricating a through-via B (see FIG. 12) and a space (1F) for separating adjacent elements are required, so the width must be at least 3F added to either the length ($n_1F$) of the spin-orbit torque type magnetoresistance effect element 100 in the x-direction or the length ($n_3F$) of the control element T in the x-direction, whichever is greater.

In this case, it is assumed that the size of the through-via B need only be the minimum processing size F in one direction. However, in actual practice, the size that is needed for fabricating a through-via B will differ depending on the manufacturer used. For this reason, if the size that is necessary for fabricating the through-via B is different, then it is necessary to add a value of twice said size in the x-direction. The reason the value must be doubled is because two through-vias are necessary. Additionally, in the y-direction, if a through-via B cannot be overlapped with a control element when viewed from the z-direction, then the size thereof also must be added to 8F.

Although the addition of through-via sizes affects the absolute value of the cell area, the relative relationships are not affected. For this reason, even if calculations are made using hypothetical numerical values, the relative sizes will not change.

As shown in Table 1, in most cases apart from Example 11, the length ($n_1F$) of the spin-orbit torque type magnetoresistance effect element 100 in the x-direction determines the size necessary in the x-direction for a unit cell in an integrated circuit.

As mentioned above, the cell area necessary for a unit cell in the integrated circuit is $8F \times \{(n_1F \text{ or } n_3F) + 3\}$. In this case, the larger of "$n_1F$ or $n_3F$" is chosen. The cell areas that are necessary for different shapes of the magnetoresistance effect element are shown in Table 1.

Figure 14:
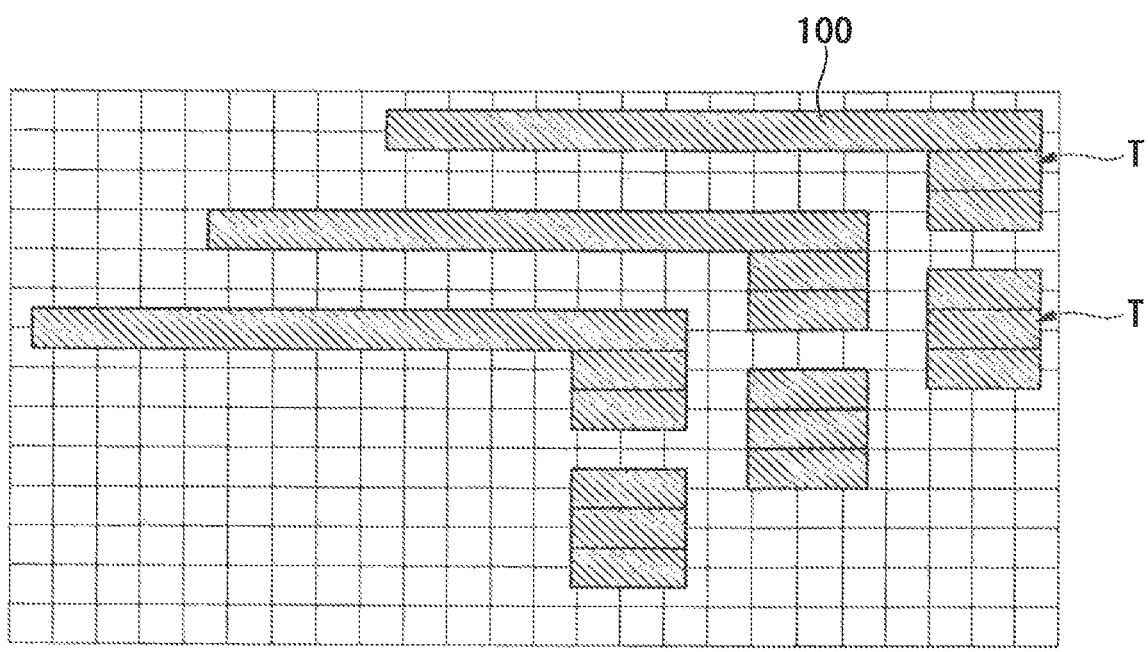
FIG. 14 is a diagram illustrating an arrangement for raising the level of integration of a spin-orbit torque type magnetoresistance effect element according to the present embodiment.

The cell area becomes larger as the difference between the width L1 ($n_1F$) of the magnetoresistance effect element 10 in the x-direction and the width ($n_3F$) of the control element T in the x-direction becomes greater. This is because, as illustrated in FIG. 12, the dead space DS in which no elements are formed increases. In other words, for the purposes of integration, it is preferable for the difference between the width L1 ($n_1F$) of the magnetoresistance effect element 10 in the x-direction and the width ($n_3F$) of the control element T in the x-direction to be smaller. As illustrated in FIG. 14, the level of integration can be increased by arranging the spin-orbit torque type magnetoresistance effect element 100 and the control elements T so as to fill in the dead space DS.

Meanwhile, in order to make the reversal current amount smaller, it is preferable to make the width L2 ($n_2F$) of the magnetoresistance effect element 10 in the y-direction smaller, even if the difference between the width L1 ($n_2F$) of the magnetoresistance effect element 10 in the x-direction and the width ($n_3F$) of the control element T in the x-direction becomes greater.

Additionally, the results of a similar analysis when assuming the minimum processing size F to be 10 nm are shown in Table 2, and the results of a similar analysis when assuming the minimum processing size F to be 28 nm are shown in Table 3. Similar results were able to be confirmed in Tables 2 and 3.

TABLE 2

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | | Integrated |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (µA) | FET Width (nm) | By Minimum Processing Size ($n_3F$) | Circuit Cell Area ($F^2$) |
| Example 12 | 10 | 1F | 630 | 63F | 10 | 10 | 100 | 6.2 | 12.4 | 2F | 528 |
| Example 13 | 20 | 2F | 315 | 32F | 20 | 10 | 200 | 12.4 | 24.8 | 3F | 280 |
| Example 14 | 30 | 3F | 210 | 21F | 30 | 10 | 300 | 18.6 | 37.2 | 4F | 192 |
| Example 15 | 40 | 4F | 158 | 16F | 40 | 10 | 400 | 24.8 | 49.6 | 5F | 152 |
| Example 16 | 50 | 5F | 126 | 13F | 50 | 10 | 500 | 31 | 62 | 7F | 128 |
| Example 17 | 60 | 6F | 105 | 11F | 60 | 10 | 600 | 37.2 | 74.4 | 8F | 112 |
| Example 18 | 70 | 7F | 90 | 9F | 70 | 10 | 700 | 43.4 | 86.8 | 9F | 96 |

TABLE 3

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | Integrated |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Circuit Cell Area ($F^2$) |
| Example 19 | 28 | 1F | 225 | 9F | 28 | 10 | 280 | 17.4 | 34.7 | 2F | 80 |
| Example 20 | 56 | 2F | 113 | 4F | 56 | 10 | 560 | 34.7 | 69.4 | 3F | 40 |
| Comparative Example 1 | 84 | 3F | 75 | 3F | 84 | 10 | 840 | 52 | 104.16 | 4F | 56 |
| Comparative Example 2 | 112 | 4F | 56 | 3F | 112 | 10 | 1120 | 69 | 138.88 | 5F | 64 |
| Comparative Example 3 | 140 | 5F | 45 | 2F | 140 | 10 | 1140 | 87 | 173.6 | 7F | 80 |
| Comparative Example 4 | 168 | 6F | 38 | 2F | 168 | 10 | 1680 | 104 | 208.32 | 8F | 88 |
| Comparative Example 5 | 196 | 7F | 32 | 2F | 196 | 10 | 1960 | 122 | 243.04 | 9F | 96 |

In Comparative Examples 1-5, the width L2 of the magnetoresistance effect element in the y-direction is greater than the width L1 in the x-direction, and a large reversal current amount is necessary for magnetization reversal. Additionally, the width of the cell area of the integrated circuit in the x-direction is dependent on the size of the control elements and the level of integration is made worse.

Element Arrangement: Second Arrangement

In the above-described first arrangement, the control elements are arranged in parallel in the y-direction, but the control elements T may also be arranged in parallel in the x-direction.

Figure 15:
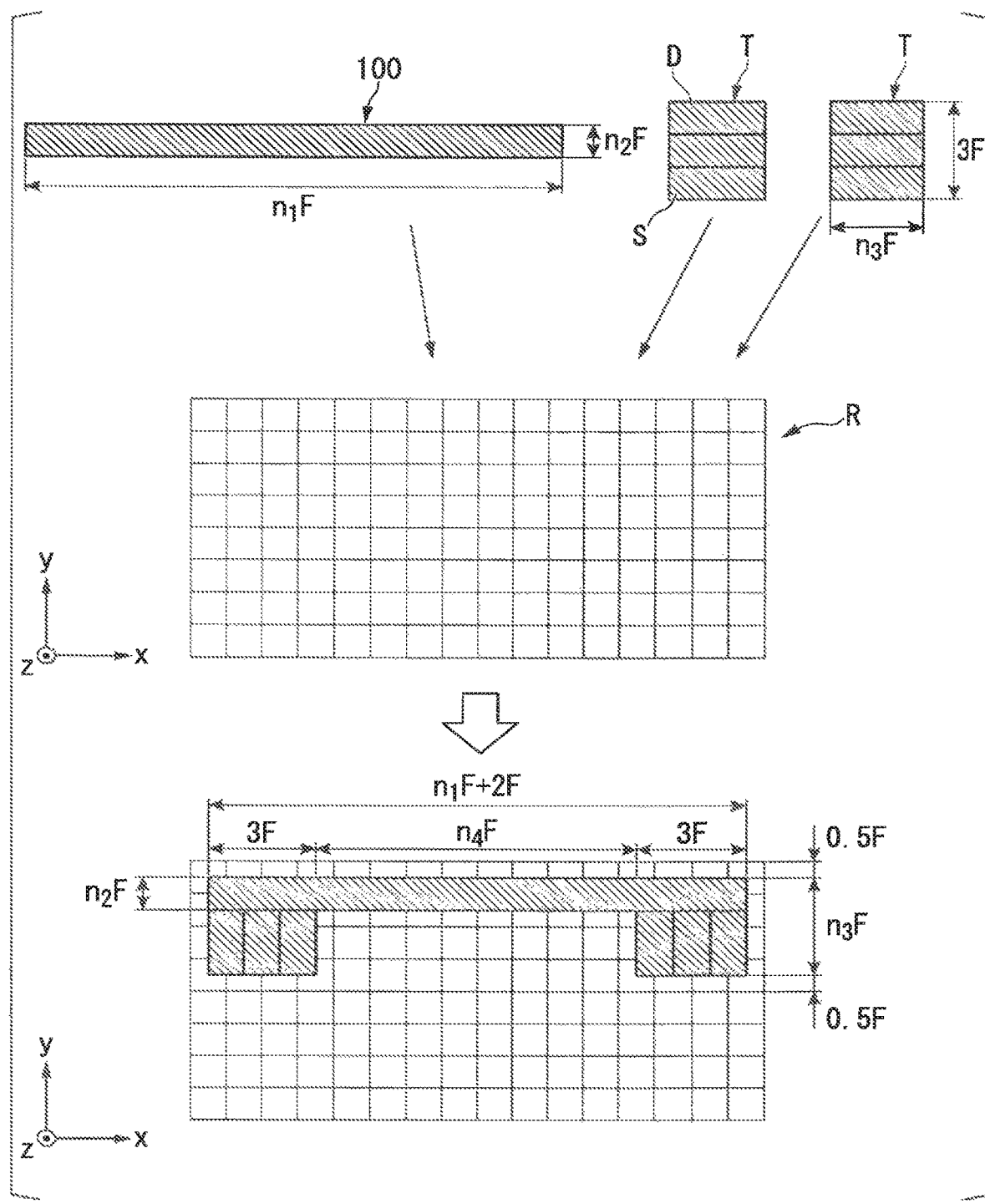
FIG. 15 is a diagram for explaining the cell size necessary for arranging one spin-orbit torque type magnetoresistance effect element and two control elements.
Figure 16:
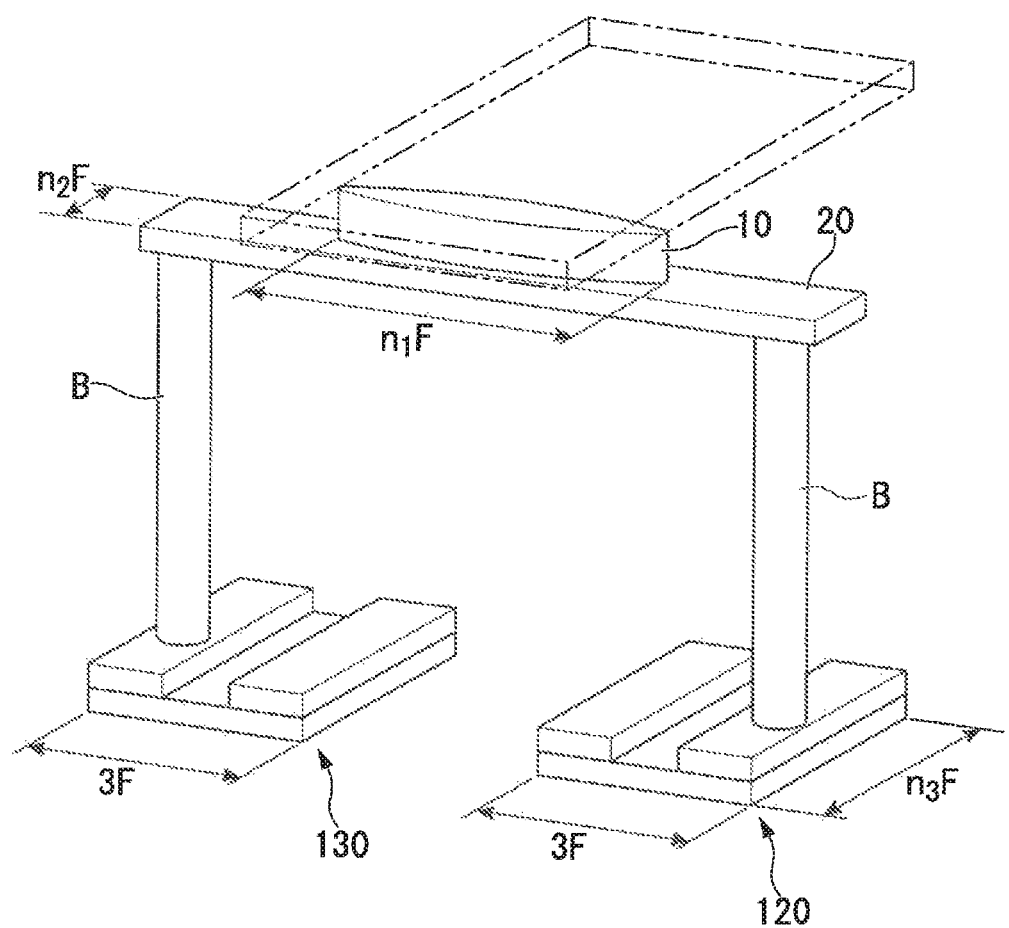
FIG. 16 is a schematic perspective view illustrating the element structure of a unit cell when one spin-orbit torque type magnetoresistance effect element and two control elements are arranged in accordance with the arrangement in FIG. 15.

FIG. 15 is a diagram for explaining the cell size necessary for arranging one spin-orbit torque type magnetoresistance effect element and two control elements. FIG. 16 is a schematic perspective view illustrating the element structure of a unit cell when one spin-orbit torque type magnetoresistance effect element and two control elements are arranged in accordance with the arrangement in FIG. 15.

In FIG. 16, an element selection control element 120 and a write control element 130 are incorporated as the control elements in a unit cell, and the structure is in accordance with the circuit diagram in FIG. 10. As illustrated in FIG. 16, the wiring that connects the three control elements is routed without resulting in any short circuits. In other words, it can be seen that the arrangement of the control elements illustrated in FIG. 16 is also possible when taking the three-dimensional structure into account. It was also confirmed that a three-dimensional structure is possible when following the circuit diagram in FIG. 9 (not shown in perspective).

As illustrated in FIG. 15, the sizes of the elements are not different. However, by changing the arrangement, the width in the x-direction that is necessary for providing two control elements changes. The width in the x-direction that is necessary for two control elements is twice the width (3F) of each element in the x-direction, plus the distance ($n_4F$) between the elements. Since the minimum distance between the elements is F, the width in the x-direction that is necessary for the two control elements must be, at minimum, 7F. Additionally, IF is necessary in order to ensure separation between adjacent unit cells, so at least 8F is necessary.

In other words, when the value ($n_1F+2F+F$) obtained by adding space (2F) for through-vias and space (F) between the cells to the length of the spin-orbit torque type magnetoresistance effect element 100 in the x-direction is greater than the minimum length (8F) of the control elements T in the x-direction, the size of the former ($n_1F+2F+F$) is necessary in the x-direction for a unit cell in the integrated circuit. Meanwhile, if the value ($n_1F+2F$) obtained by adding the space for two through-vias to the length of the spin-orbit torque type magnetoresistance effect element 100 in the x-direction is smaller than the minimum length (8F) of the control elements T in the x-direction, the size of the latter (8F) is necessary in the x-direction for a unit cell in the integrated circuit.

On the other hand, in the y-direction of a unit cell in the integrated circuit, the size must be at least either the length ($n_2F$) of the spin-orbit torque type magnetoresistance effect element 100 in the y-direction or the length ($n_3F$) of a control element T in the y-direction. In actual practice, a space (1F) for separating adjacent elements is required, so the width must be at least F added to either the length ($n_2F$) of the spin-orbit torque type magnetoresistance effect element 100 in the y-direction or the length ($n_3F$) of a control element T in the y-direction, whichever is greater.

For this reason, the cell area necessary for a unit cell in the integrated circuit is $\{(n_1F+2F+F) \text{ or } 8F\} \times \{(n_2F+F) \text{ or } (n_3F+F)\}$. The "or" in the cell area measurement calculation indicates that the larger of the two values is chosen.

The cell areas that are necessary for different shapes of the magnetoresistance effect element, when the minimum processing size F is assumed to be 7 nm, are shown in Table 4. The cell areas that are necessary for different shapes of the magnetoresistance effect element, when the minimum processing size F is assumed to be 10 nm, are shown in Table 5. The cell areas that are necessary for different shapes of the magnetoresistance effect element, when the minimum processing size F is assumed to be 28 nm, are shown in Table 6. Since the sizes of the elements are unchanged, the values other than the cell sizes of the integrated circuits match with those in Tables 1 to 3.

TABLE 4

Spin-Orbit Torque Type Magnetoresistance Effect Element

| | Magnetoresistance Effect Element | | | | Spin-Orbit Torque Wiring | | | | Control Element | | Integrated |
|---|---|---|---|---|---|---|---|---|---|---|---|
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Circuit Cell Area ($F^2$) |
| Example 21 | 7 | 1F | 900 | 129F | 7 | 10 | 70 | 4.3 | 8.68 | 2F | 396 |
| Example 22 | 14 | 2F | 450 | 65F | 14 | 10 | 140 | 8.7 | 17.36 | 3F | 272 |
| Example 23 | 21 | 3F | 300 | 43F | 21 | 10 | 210 | 13.0 | 26.04 | 4F | 230 |
| Example 24 | 28 | 4F | 225 | 33F | 28 | 10 | 280 | 17.4 | 34.72 | 5F | 216 |
| Example 25 | 35 | 5F | 180 | 26F | 35 | 10 | 350 | 21.7 | 43.4 | 7F | 232 |
| Example 26 | 42 | 6F | 150 | 22F | 42 | 10 | 420 | 26.0 | 52.08 | 8F | 225 |
| Example 27 | 49 | 7F | 129 | 19F | 49 | 10 | 490 | 30.4 | 60.76 | 9F | 220 |
| Example 28 | 56 | 8F | 113 | 17F | 56 | 10 | 560 | 34.7 | 69.44 | 10F | 220 |
| Example 29 | 63 | 9F | 100 | 15F | 63 | 10 | 630 | 39.1 | 78.12 | 12F | 234 |
| Example 30 | 70 | 10F | 90 | 13F | 70 | 10 | 700 | 43.4 | 86.8 | 13F | 224 |
| Example 31 | 77 | 11F | 82 | 12F | 77 | 10 | 770 | 47.7 | 95.48 | 14F | 225 |

TABLE 5

Spin-Orbit Torque Type Magnetoresistance Effect Element

| | Magnetoresistance Effect Element | | | | Spin-Orbit Torque Wiring | | | | Control Element | | Integrated |
|---|---|---|---|---|---|---|---|---|---|---|---|
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Circuit Cell Area ($F^2$) |
| Example 32 | 10 | 1F | 630 | 63F | 10 | 10 | 100 | 6.2 | 12.4 | 2F | 198 |
| Example 33 | 20 | 2F | 315 | 32F | 20 | 10 | 200 | 12.4 | 24.8 | 3F | 140 |
| Example 34 | 30 | 3F | 210 | 21F | 30 | 10 | 300 | 18.6 | 37.2 | 4F | 120 |
| Example 35 | 40 | 4F | 158 | 16F | 40 | 10 | 400 | 24.8 | 49.6 | 5F | 114 |
| Example 36 | 50 | 5F | 126 | 13F | 50 | 10 | 500 | 31 | 62 | 7F | 128 |
| Example 37 | 60 | 6F | 105 | 11F | 60 | 10 | 600 | 37.2 | 74.4 | 8F | 126 |
| Example 38 | 70 | 7F | 90 | 9F | 70 | 10 | 700 | 43.4 | 86.8 | 9F | 120 |

TABLE 6

Spin-Orbit Torque Type Magnetoresistance Effect Element

| | Magnetoresistance Effect Element | | | | Spin-Orbit Torque Wiring | | | | Control Element | | Integrated |
|---|---|---|---|---|---|---|---|---|---|---|---|
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Circuit Cell Area ($F^2$) |
| Example 39 | 28 | 1F | 225 | 9F | 28 | 10 | 280 | 17.4 | 34.7 | 2F | 36 |
| Example 40 | 56 | 2F | 113 | 4F | 56 | 10 | 560 | 34.7 | 69.4 | 3F | 32 |
| Comparative Example 6 | 84 | 3F | 75 | 3F | 84 | 10 | 840 | 52 | 104.16 | 4F | 40 |
| Comparative Example 7 | 112 | 4F | 56 | 3F | 112 | 10 | 1120 | 69 | 138.88 | 5F | 48 |
| Comparative Example 8 | 140 | 5F | 45 | 2F | 140 | 10 | 1140 | 87 | 173.6 | 7F | 64 |
| Comparative Example 9 | 168 | 6F | 38 | 2F | 168 | 10 | 1680 | 104 | 208.32 | 8F | 72 |
| Comparative Example 10 | 196 | 7F | 32 | 2F | 196 | 10 | 1960 | 122 | 243.04 | 9F | 80 |

REFERENCE SIGNS LIST

1 First ferromagnetic metal layer
2 Second ferromagnetic metal layer
3 Non-magnetic layer
10, 11, 12, 13, 14, 15 Magnetoresistance effect element
20 Spin-orbit torque wiring
30 First wiring
40 Second wiring
50 Insulator
100, 102 Spin-orbit torque type magnetoresistance effect element
101 Spin-transfer torque type magnetoresistance effect element
110 Read control element
120 Element selection control element
130 Write control element
T Control element S Source electrode
D Drain electrode
C Channel
e1 First end portion
e2 Second end portion
e3 Third end portion
e4 Fourth end portion
S1 First spin
S2 Second spin
I Electric current
Js Pure spin current
PM Photomask

What is claimed is:

1. A unit cell in an integrated circuit comprising a spin-orbit torque type magnetoresistance effect element and a control element,
   wherein the spin-orbit torque type magnetoresistance effect element comprising:
   a magnetoresistance effect element having a first ferromagnetic metal layer with a fixed magnetization direction, a second ferromagnetic metal layer with a varying magnetization direction, and a non-magnetic layer sandwiched between the first ferromagnetic metal layer and the second ferromagnetic metal layer; and
   spin-orbit torque wiring that extends in a first direction intersecting with a stacking direction of the magnetoresistance effect element and that is joined to the second ferromagnetic metal layer;
   wherein
   the magnetization of the second ferromagnetic metal layer is oriented in the stacking direction of the magnetoresistance effect element; and
   the second ferromagnetic metal layer has shape anisotropy, such that a length along the first direction is greater than a length along a second direction orthogonal to the first direction and to the stacking direction, and
   wherein
   the control element is a transistor comprising a source electrode, a drain electrode and a channel;
   the control element is arranged in a third direction from the source electrode to the drain electrode; and
   the third direction is in parallel in the second direction.

2. The unit cell according to claim 1, wherein the magnetoresistance effect element has an elliptical region that is inscribed in a planar shape of the magnetoresistance effect element when viewed from the stacking direction, and an external region that is positioned outside the elliptical region in the first direction.

3. The unit cell according to claim 1, wherein the magnetoresistance effect element is rectangular when viewed from the stacking direction.

4. The unit cell according to claim 1, wherein a length of the magnetoresistance effect element in the first direction is not more than 60 nm.

5. The unit cell according to claim 1, wherein
   when end portions of the spin-orbit torque wiring in the second direction are defined as a first end portion and a second end portion; and
   of the end portions of the magnetoresistance effect element in the second direction, the end portion on the side closer to the first end portion is defined as a third end portion and the end portion on the side closer to the second end portion is defined as a fourth end portion;
   a distance between the first end portion and the third end portion and a distance between the second end portion and the fourth end portion are both greater than zero, and at least one of the distances is not more than a spin diffusion length of the spin-orbit torque wiring.

6. The unit cell according to claim 5, wherein the distance between the first end portion and the third end portion is different from the distance between the second end portion and the fourth end portion.

7. A method for producing the unit cell according to claim 3, the method comprising:
   a step of forming a stacked body having the first ferromagnetic metal layer, and the non-magnetic layer and the second ferromagnetic metal layer;
   a step of processing the stacked body in one direction;
   a step of processing the stacked body, after having been processed in the one direction, in another direction intersecting with the one direction; and
   a step of processing the control element.

8. A method for producing the unit cell according to claim 1, the method comprising:
   a step of forming a stacked body having the first ferromagnetic metal layer, and the non-magnetic layer and the second ferromagnetic metal layer;
   a step of forming, on one surface of the stacked body, a mask having a rectangular region in which an ellipse can be inscribed when viewed from the stacking direction of the stacked body, and a projecting region that is positioned at a corner or a long side of the rectangular region and that projects from the rectangular region;
   a step of processing the stacked body through the mask; and
   a step of processing the control element.

* * * * *